(12) United States Patent
Maenishi et al.

(10) Patent No.: US 7,571,539 B2
(45) Date of Patent: Aug. 11, 2009

(54) COMPONENT VERIFICATION METHOD AND APPARATUS

(75) Inventors: Yasuhiro Maenishi, Koufu (JP); Chikashi Konishi, Kurume (JP); Ikuo Yoshida, Uji (JP); Hiroyoshi Nishida, Minamiarupusu (JP); Masaya Matsumoto, Ogouri (JP); Akihito Yamasaki, Kurume (JP); Takuya Yamazaki, Tosu (JP)

(73) Assignee: Panasonic Corporation, Osaka (JP)

( * ) Notice: Subject to any disclaimer, the term of this patent is extended or adjusted under 35 U.S.C. 154(b) by 433 days.

(21) Appl. No.: 10/566,835

(22) PCT Filed: Aug. 24, 2004

(86) PCT No.: PCT/JP2004/012453

§ 371 (c)(1),
(2), (4) Date: Feb. 2, 2006

(87) PCT Pub. No.: WO2005/020656

PCT Pub. Date: Mar. 3, 2005

(65) Prior Publication Data

US 2006/0207089 A1    Sep. 21, 2006

(30) Foreign Application Priority Data

Aug. 26, 2003 (JP) ............................. 2003-301838
Nov. 7, 2003 (JP) ............................. 2003-378373

(51) Int. Cl.
*H05K 3/30* (2006.01)

(52) U.S. Cl. .............................. 29/834; 29/712; 29/739; 29/832; 206/713; 700/231

(58) Field of Classification Search .................. 29/709, 29/712, 739–741, 832–834; 206/459.5, 713, 206/714; 221/6, 14, 73; 700/231
See application file for complete search history.

(56) References Cited

U.S. PATENT DOCUMENTS 5,400,497 A     3/1995  Watanabe et al.

(Continued)

FOREIGN PATENT DOCUMENTS

EP                 0 453 370             10/1991

(Continued)

OTHER PUBLICATIONS

Japanese Office Action mailed Sep. 24, 2008 in corresponding Japanese Patent Application No. 2004-245858.

(Continued)

*Primary Examiner*—Donghai D. Nguyen
(74) *Attorney, Agent, or Firm*—Wenderoth, Lind & Ponack, L.L.P.

(57) ABSTRACT

A component verification method for a mounter (100) that is capable of performing component verification with less labor. The method includes a position specification step (S12A) of specifying a placement position in the mounter (100) where a component tape is placed; a read step (S13) of reading component information from an IC tag (426*b*) that is attached to the component tape or a reel (426); and a verification step (S14) of verifying the component information and the placement position against component arrangement data that indicates components that should be mounted onto the board as well a position where the component tape should be placed.

11 Claims, 36 Drawing Sheets

U.S. PATENT DOCUMENTS

| | | | |
|---|---|---|---|
| 5,553,376 A * | 9/1996 | Solanki et al. ............... 29/833 |
| 5,713,125 A | 2/1998 | Watanabe et al. |
| 6,002,650 A | 12/1999 | Kuribayashi et al. |
| 6,157,870 A * | 12/2000 | Gfeller et al. ............... 700/231 |
| 6,332,536 B2 * | 12/2001 | Easton ............... 206/714 |
| 6,595,418 B1 | 7/2003 | Igarashi et al. |
| 6,694,606 B1 | 2/2004 | Ohashi et al. |
| 2001/0020325 A1 | 9/2001 | Lueckehe |
| 2002/0184747 A1 | 12/2002 | Kuribayashi et al. |
| 2004/0078962 A1 | 4/2004 | Ohashi et al. |

FOREIGN PATENT DOCUMENTS

| | | |
|---|---|---|
| JP | 3-268492 | 11/1991 |
| JP | 4-164398 | 6/1992 |
| JP | 7-22778 | 1/1995 |
| JP | 9-252195 | 9/1997 |
| JP | 11-317595 | 11/1999 |
| JP | 2000-13092 | 1/2000 |
| JP | 2000-338212 | 12/2000 |
| JP | 2001-97511 | 4/2001 |
| JP | 2002-207079 | 7/2002 |
| JP | 2003-174662 | 6/2003 |
| JP | 2003-182820 | 7/2003 |
| JP | 2004-165603 | 6/2004 |

OTHER PUBLICATIONS

Japanese Office Action issued Dec. 16, 2008 in Japanese Patent Application No. 2004-245858.

* cited by examiner

FIG. 5A

```
          215a
     ┌─────────┐
     Z97     Z144
  ┌────────┬────────┐
  │C block │D block │ 215b
  │        │        │ Z145
  │        │        │
  │        │   Z192 │
  ├────────┼────────┤
  │B block │A block │
  │        │        │
  Z96     Z49  Z48  Z1
  └────────┴────────┘
     115b       115a
         │
    ┌─────────┐
    │  Tray   │
    │supplier │
    └─────────┘
```

FIG. 5B

| Component cassettes | | A | | | | B | | | | C | | | | D | | | | |
|---|---|---|---|---|---|---|---|---|---|---|---|---|---|---|---|---|---|---|---|
| | | Z1 | Z48 | | | Z49 | Z96 | | | Z97 | Z144 | | | Z145 | Z192 | | | |
| Tape width | | Z1 | Z3 | Z45 | Z47 | No. of tapes | Z49 | Z51 | Z93 | Z95 | No. of tapes | Z97 | Z99 | Z141 | Z143 | No. of tapes | Z145 | Z147 | Z189 | Z191 | No. of tapes | No. of Z positions | Occupied consecutive positions |
| 8 (Double) | ○ | ○ | ○ | ○ | 48 | ○ | ○ | ○ | ○ | 48 | ○ | ○ | ○ | ○ | 48 | ○ | ○ | ○ | ○ | 48 | 192 | 1 |
| 8 (Single) | ○ | ○ | ○ | ○ | 24 | ○ | ○ | ○ | ○ | 24 | ○ | ○ | ○ | ○ | 24 | ○ | ○ | ○ | ○ | 24 | 96 | 1 |
| 12 | ○ | ○ | ○ | ○ | 24 | ○ | ○ | ○ | ○ | 24 | ○ | ○ | ○ | ○ | 24 | ○ | ○ | ○ | ○ | 24 | 96 | 1 |
| 16 | ○ | ○ | ○ | ○ | 12 | ○ | ○ | ○ | ○ | 12 | ○ | ○ | ○ | ○ | 12 | ○ | ○ | ○ | ○ | 12 | 48 | 2 |
| 24 | ○ | ○ | ○ | ○ | 12 | ○ | ○ | ○ | ○ | 12 | ○ | ○ | ○ | ○ | 12 | ○ | ○ | ○ | ○ | 12 | 48 | 2 |
| 32 | ○ | ○ | ○ | ○ | 12 | ○ | ○ | ○ | ○ | 12 | ○ | ○ | ○ | ○ | 12 | ○ | ○ | ○ | ○ | 12 | 48 | 2 |
| 44 | ○ | ○ | ○ | – | 8 | ○ | ○ | ○ | – | 8 | ○ | ○ | ○ | – | 8 | ○ | ○ | ○ | – | 8 | 32 | 3 |
| 56 | ○ | ○ | – | – | 6 | ○ | ○ | – | – | 6 | ○ | ○ | – | – | 6 | ○ | ○ | – | – | 6 | 24 | 4 |
| 72 | ○ | ○ | – | – | 6 | ○ | ○ | – | – | 6 | ○ | ○ | – | – | 6 | ○ | ○ | – | – | 6 | 24 | 4 |

| 10 nozzle heads | Inner side | Z1 Z2 | Z3 Z4 | Z5 Z6 | Z7 Z8 | Z9 Z10 | Z11 Z12 | Z13 Z14 | Z15 Z16 | Z17 Z18 | Z19 ~ Z86 | Z87 Z88 | Z89 Z90 | Z91 Z92 | Z93 Z94 | Z95 Z96 |
|---|---|---|---|---|---|---|---|---|---|---|---|---|---|---|---|---|
| | Outer side | Z97 Z98 | Z99 Z100 | Z101 Z102 | Z103 Z104 | Z105 Z106 | Z107 Z108 | Z109 Z110 | Z111 Z112 | Z113 Z114 | Z115 ~ Z182 | Z183 Z184 | Z185 Z186 | Z187 Z188 | Z189 Z190 | Z191 Z192 |
| Heads (Nozzles) | H1 | ○ | ○ | ○ | ○ | ○ | ○ | ○ | ○ | ○ | ○ | — | — | — | — | — |
| | H2 | — | ○ | ○ | ○ | ○ | ○ | ○ | ○ | ○ | ○ | ○ | — | — | — | — |
| | H3 | — | — | ○ | ○ | ○ | ○ | ○ | ○ | ○ | ○ | ○ | ○ | — | — | — |
| | H4 | — | — | — | ○ | ○ | ○ | ○ | ○ | ○ | ○ | ○ | ○ | ○ | — | — |
| | H5 | — | — | — | — | ○ | ○ | ○ | ○ | ○ | ○ | ○ | ○ | ○ | ○ | — |
| | H6 | — | — | — | — | — | ○ | ○ | ○ | ○ | ○ | ○ | ○ | ○ | ○ | ○ |
| | H7 | — | — | — | — | — | — | ○ | ○ | ○ | ○ | ○ | ○ | ○ | ○ | ○ |
| | H8 | — | — | — | — | — | — | — | ○ | ○ | ○ | ○ | ○ | ○ | ○ | ○ |
| | H9 | — | — | — | — | — | — | — | — | ○ | ○ | ○ | ○ | ○ | ○ | ○ |
| | H10 | — | — | — | — | — | — | — | — | — | ○ | ○ | ○ | ○ | ○ | ○ |

○ : Picking up possible
— : Picking up impossible 423a  423b  423c  423d

Mounting points $p_i$ = (Component type $C_i$, X coordinate $X_i$, Y coordinate $Y_i$, Control data $\phi_i$)

NC data is a list of mounting points $p_i$ $$\text{NC data} = \begin{pmatrix} p_1 \\ p_2 \\ p_3 \\ \cdot \\ \cdot \\ \cdot \\ p_N \end{pmatrix} = \begin{pmatrix} c_1, x_1, y_1, \phi_1 \\ c_2, x_2, y_2, \phi_2 \\ c_3, x_3, y_3, \phi_3 \\ \cdot \\ \cdot \\ \cdot \\ c_N, x_N, y_N, \phi_N \end{pmatrix}$$

| Component name | (Appea-rance) | Component size (mm) | | | 2-D recognition method | Pick-up nozzle | Tact time (sec.) | Speed XY |
|---|---|---|---|---|---|---|---|---|
| | | X | Y | L | | | | |
| 0603CR | | 0.6 | 0.3 | 0.25 | | SX | 0.086 | 1 |
| 1005CR | | 1.0 | 0.5 | 0.3-0.5 | | SA | | |
| 1608CR | | 1.6 | 0.8 | 0.4-0.8 | | S | 0.094 | |
| 2012CR | | 2.0 | 1.25 | 0.4-0.8 | | | | |
| 3216CR | | 3.2 | 1.6 | 0.4-0.8 | | | | |
| 4TR | | 2.8 | 2.8 | 1.1 | | Cylindrical tip | 0.11 | |
| 6TR | | 4.3 | 4.5 | 1.5 | | | | |
| 1TIP | | 2.0 | φ1.0 | - | | | | |
| 2TIP | | 3.6 | φ1.4 | - | | | | |
| 1CAP | | 3.8 | 1.9 | 1.6 | Reflection | S | | |
| 2CAP | | 4.7 | 2.6 | 2.1 | | | | |
| 3CAP | | 6.0 | 3.2 | 2.5 | | M | | |
| 4CAP | | 7.3 | 4.3 | 2.8 | | | | |
| SCAP | | 4.3 | 4.3 | 6.0 | | | | |
| LCAP | | 6.6 | 6.6 | 6.0 | | | | |
| LLCAP | | 10.3 | 10.3 | 10.5 | | ML | | |
| 1VOL | | 4.5 | 3.8 | 1.6-2.4 | | M | 0.13 | 2 |
| 2VOL | | 3.7 | 3.0 | 1.6 | | | | |
| 3VOL | | 4.8 | 4.0 | 3.0 | | | | |

FIG. 14

| Component name | Unit ID | Z number |
|---|---|---|
| 0603CR | 110 | 5 |
| 1005CR | 120 | 8 |
| 1608CR | 210 | 4 |
| 2012CR | 120 | 22 |

FIG. 30

| Board ID:PB01ID/ Lot number:PB01Rt | | | | Operation result information 507a | | | |
|---|---|---|---|---|---|---|---|
| B1 | B2 | B3 | B4 | B5 | | | B6 |
| | | | | Error | | | |
| Machine name | Date/time of insertion | Tact time | PG | Date/time of occurrence | Code | Step | Index |
| CM402 | 2003/01/06 11:16:34 | 35 sec | PTESTA | 2003/01/06 11:16:55 | MC0005 | 100 | Idx 01 |
| NM2544 | ... | ... | ... | ... | ... | ... | ... |
| ... | | | | | | | |

FIG. 31

Mounted component information 507b

| | C1 | C2 | C3 | C4 | C5 |
|---|---|---|---|---|---|
| | Position | Component name | Serial number | Lot number | Z-axis |
| Index:Idx01 | X1, Y1 | 1005C.R | ser0001 | lot0002 | 10 |
| Index:Idx02 | X2, Y2 | 1006C.R | ser0002 | lot0003 | 11 |
| Index:Idx03 | X3, Y3 | ... | ... | ... | ... |

COMPONENT VERIFICATION METHOD AND APPARATUS

BACKGROUND OF THE INVENTION

1. Technical Field

The present invention relates to a component verification method that is used for mounting electronic components by a mounter, and particularly to a component verification method utilizing an integrated circuit (IC) tag.

2. Description of the Related Art

Mounters that mount electronic components onto boards such as printed boards are required to perform verification to see if correct components have been placed on a component cassette before mounting operation. Conventional mounters include one that performs component verification by use of information such as component names and the number of components represented as barcodes (for example, see Japanese Patent publication No. 2932670).

A barcode is attached to a reel around which a component tape is wound. Before component verification is carried out, information contained in a barcode is read by a barcode reader to be written into a memory. Note that memory is included in each component cassette to which a reel is loaded. With this construction, it is possible to automatically perform component verification by scanning the memory of each cassette by use of a memory reader and thus to find setting errors of component cassettes.

Here, the expression "component tape" refers to a tape (a carrier tape) on which a number of the same type of components have been arranged, with such tape being supplied from a reel (a supply reel) or the like around which the tape has been wound. Furthermore, components supplied by a component tape are sometimes called "taped components".

However, there is a problem with the conventional mounter in that it is necessary, prior to component verification, to transport barcode information to the memory of each component cassette for each type of tapes to be used. In general, the number of component tape types to be handled by one mounter is 20 to 50, and sometimes amounts to 100, and thus, it is troublesome for workers to transport barcode information to the memory of each component cassette for each of all such types of component tapes.

Furthermore, in order to perform component verification, it is necessary to move the memory of each component cassette close to the read unit of a mounter or to move the read unit itself at the start of a mounting operation, and then read information stored in the memory of each component cassette by scanning. This requires time for performing a component verification operation and thus causes a problem that operating loss occurs. Furthermore, it is also a problem that misplacement of components cannot be discovered until a scan operation gets started by the above read unit, i.e., a machine is put into operation.

Moreover, the conventional mounter is required to prepare a component library beforehand, which causes another problem that extra labor hours are required for generating a component library. "Component library" is a collection of information (e.g. component names, component sizes, component colors and component shapes) about each of all the component types that can be handled by a mounter. Without such information about components to be mounted, a mounter cannot mount such components.

The present invention has been conceived in view of the above problems, and it is an object of the present invention to provide a component verification method for a mounter that enables component verification to be performed with less labor.

Another object of the present invention is to provide a component verification method for a mounter that causes fewer operating losses at the time of component mounting.

Further, another object of the present invention is to provide a component library generation method for a mounter that requires little labor.

SUMMARY OF THE INVENTION

In order to achieve the above objectives, the component verification method according to the present invention is a component verification method for verifying, by use of a computer, a component taken out by a mounter from a component holder against a component that should be mounted onto a board by said mounter, said component holder holding a plurality of components, wherein the component holder is placed in the mounter with an integrated circuit (IC) tag being attached to said component holder, said IC tag storing identification information for identifying the components held by the component holder, and the component verification method comprises: a position specification step of specifying a placement position on the mounter where the component holder is placed; a read step of reading the identification information from the IC tag attached to the component holder; and a verification step of verifying (i) the identification information read out in the read step against prescribed component information for identifying a component that should be mounted onto the board, and (ii) the placement position specified in the position specification step against prescribed position information indicating a position where the component holder should be placed. For example, in the position specification step, the placement position of the component holder is specified based on a state of a signal that is outputted from the IC tag via a wireless communication medium.

With the above construction, the identification information is read from the IC tag attached to the component holder so as to be verified against the prescribed component information. This makes it possible to save the labor of loading information contained in a barcode attached to a supply reel into the memory of a component cassette prior to component verification, as conventionally required, and thus to perform component verification with fewer labor hours. Moreover, since the identification information is read from the IC tag via a wireless communication, it becomes not necessary to move the head or a component cassette, making it possible to reduce operating losses at component mounting time. What is more, since the placement position of the component holder is specified so as to be verified against the prescribed component information, it becomes possible to find a placement error of a component holder if there is any. Here, since the placement position of the component holder is specified based on a state of the signal such as electric waves outputted from the IC tag, there is no need to move the component cassette to specify such placement position, which results in further reduction in operating losses at the time of component mounting.

Preferably, the component holder is a component tape, and the component verification method further comprises a detection step of detecting a seam where the component tape and a new component tape are connected, said new component tape having been newly placed in the mounter, wherein in the read step, identification information for identifying components held by the new component tape is further read from an IC tag that is attached to said new component tape, when the seam is detected in the detection step, and in the verification step, the identification information corresponding to the new component tape read out in the read step is further verified against the prescribed component information.

Accordingly, when a new component tape is connected, identification information is read from the IC tag of such new component tape and verified against the prescribed component information, making it possible to find and prevent such an error of connecting a wrong component tape.

Also, the component number examination method according to the present invention is a component number examination method for examining, by use of a computer, a number of components held by a component holder that holds a plurality of components, said number of components being subject to change when a component is taken out from said component holder by a mounter, wherein the component holder is placed in the mounter with an integrated circuit (IC) tag being attached to said component holder, said IC tag storing the number of components and identification information for identifying the components held by the component holder, and the component number examination method comprises the following steps in addition to the steps included in the component verification method according to claim 1: a component number read step of reading the number of components from the IC tag attached to the component holder; a decrement step of decrementing the number of components read out in the component number read step by one, every time the mounter takes out a component from the component holder for mounting the component onto a board; and a warning step of issuing a warning when the number of components after the decrement in the decrement step becomes less than a predetermined value.

With the above construction, the number of components read out in the component number read step is decremented every time a component is taken out from the holder and a warning is issued when the resulting number becomes small. Accordingly, it becomes possible to easily examine the remaining number of components held by the component holder and thus to replace such component holder by a new one before all the components are taken out as well as to reduce operations losses at the time of component mounting.

Furthermore, the component arrangement data generation method according to the present invention is a component arrangement data generation method for generating, by use of a computer, component arrangement data for a mounter that mounts a component onto a board, said component arrangement data indicating a relationship between a placement position where a component holder holding a plurality of components is placed and the components held by said component holder, wherein the component holder is placed in the mounter with an integrated circuit (IC) tag being attached to said component holder, said IC tag storing identification information for identifying the components held by the component holder, and the component arrangement data generation method comprises: a position specification step of specifying the placement position on the mounter where the component holder is placed; a read step of reading the identification information from the IC tag attached to the component holder; and a data generation step of generating the component arrangement data in which the placement position specified in the position specification step is associated with the identification information read out in the read step. For example, in the position specification step, the placement position of the component holder is specified based on a state of a signal that is outputted from the IC tag via a wireless communication medium.

With the above construction, since the placement position of the component holder is specified and the identification information of the components held by such component holder is then read from the IC tag so as to generate the component arrangement data. Accordingly, it becomes not necessary to verify by human hands the placement position against the identification information before generating component arrangement data. Instead, component arrangement data is generated quickly and easily simply by placing a component holder in the mounter. Furthermore, in the case where the placement position is specified based on how a signal such as electric waves is outputted from the IC tag, the above construction can further save the labor of moving a component cassette to specify its position.

Also, the component library generation method according to the present invention is a component library generation method for generating, by use of a computer, a component library that is a collection of information related to components held by a component holder placed in a mounter, wherein the component holder is attached with an integrated circuit (IC) tag storing identification information for identifying the components held by the component holder, and the component library generation method comprises: a read step of reading the identification information from the IC tag attached to the component holder; and a generation step of generating the component library that includes the identification information read out in the read step.

With the above construction, since the identification information is read from the IC tag that is attached to the component holder so as to generate the component library, it becomes not necessary to verify the identification information by human hands before generating a component library. As a result, it becomes possible to generate a component library quickly and easily.

Furthermore, the component management method according to the present invention is a component management method for managing, by use of a computer, a component that has been taken out from a component holder and mounted onto a board by a mounter, said component holder holding a plurality of components, wherein the component holder is attached with a first integrated circuit (IC) tag storing identification information for identifying the components held by the component holder, and the component management method comprises: a read step of reading the identification information from the first IC tag attached to the component holder; a mounting step of successively taking out the components from the component holder and mounting said components onto the board; and a write step of writing, to a second IC tag attached to the board, the identification information read out in the read step that is associated with each of the components mounted in the mounting step.

With the above construction, the identification information about the components mounted on the board is written in the second IC tag that is attached to such board. Thus, even when a deficiency occurs on the board, it is possible to investigate the cause of such deficiency by reading out the identification information written in the second IC tag.

Also, a component holder according to the present invention is a component holder that holds a plurality of components, comprising an integrated circuit (IC) tag storing identification information for identifying said plurality of components.

With the above construction, since the IC tag that stores the identification information is attached, it is possible to easily read the identification information from such IC tag via a wireless communication medium. This makes it possible to save the labor of loading information contained in a barcode attached to a reel into the memory of a component cassette prior to component verification, as conventionally required, and thus to perform component verification with fewer labor hours. What is more, since there is no need to move a component cassette to read the identification information, operations losses at the time of component mounting is reduced.

Note that not only is it possible to embody the present invention as a variety of methods described above, but also as a variety of apparatuses that includes, as their units, the steps included in such methods, and as programs that cause a computer to execute each of these steps. It should be also noted that such programs can be distributed on recording medium such as CD-ROM (Compact Disc-Read Only Memory) and via transmission medium such as the Internet.

The disclosure of Japanese Patent Application No. 2003-301838 filed on Aug. 26, 2003, and the disclosure of Japanese Patent Application No. 2003-378373 filed on Nov. 7, 2003 including specification, drawings and claims are incorporated herein by reference in its entirety.

BRIEF DESCRIPTION OF DRAWINGS

These and other objects, advantages and features of the invention will become apparent from the following description thereof taken in conjunction with the accompanying drawings that illustrate a specific embodiment of the invention. In the Drawings:

FIG. 5A is a diagram showing one example of the specific construction of the four component supplying units within the two stages provided in the mounter according to the first embodiment of the present invention;

FIG. 5B is a table showing the number of component cassettes of various types and their positions on the Z-axis;

FIG. 12 is a diagram showing an example of a component library according to the first embodiment of the present invention;

FIG. 14 is a diagram showing one example of component arrangement data stored in the component arrangement data storing unit according to the first embodiment of the present invention;

FIG. 30 is a diagram showing the details of operation result information according to the third embodiment of the present invention;

FIG. 31 is a diagram showing details of mounted component information according to the third embodiment of the present invention;

DETAILED DESCRIPTION OF THE INVENTION

First Embodiment

Figure 1:
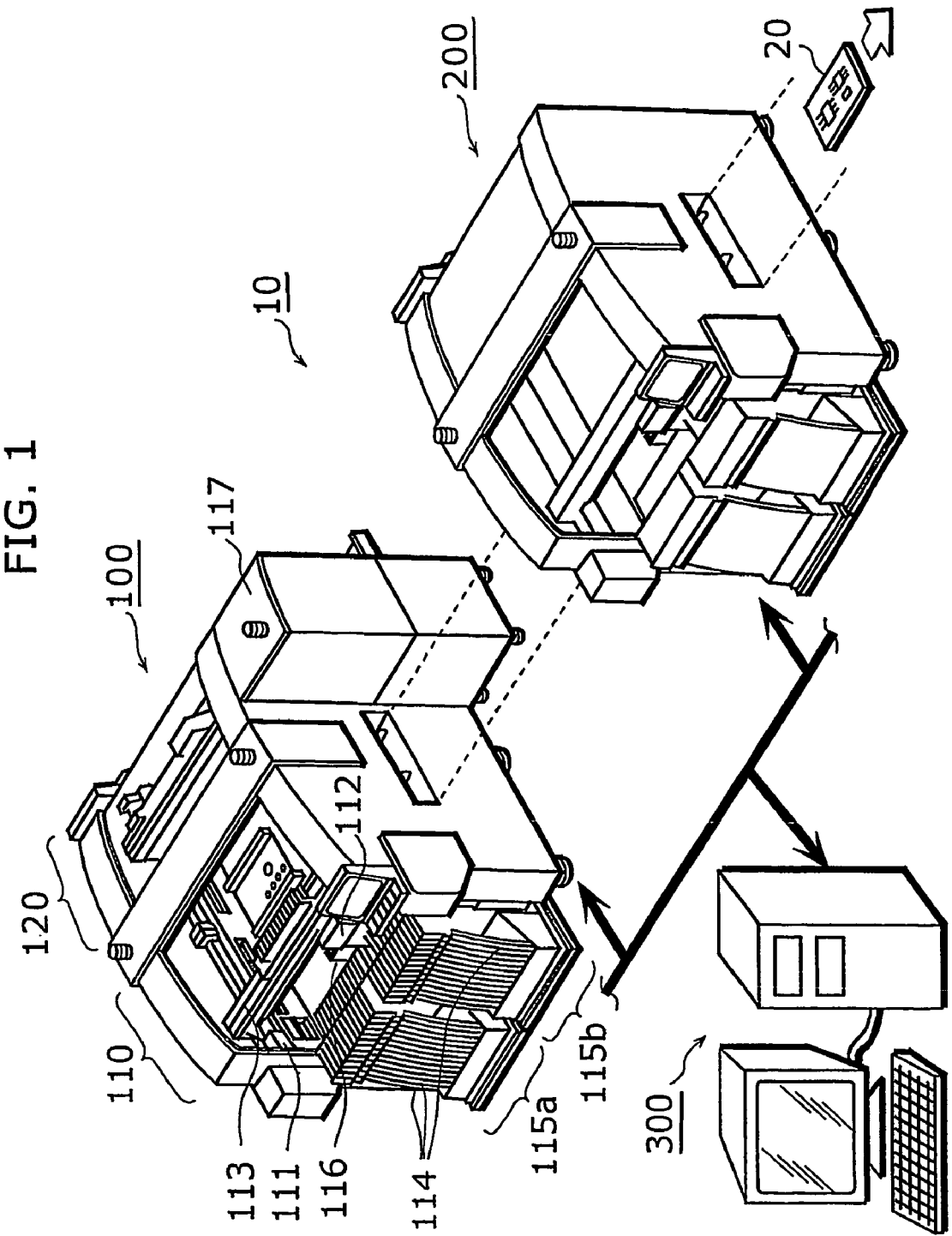
FIG. 1 is an external view showing the entire construction of a component mounting system according to a first embodiment of the present invention.

Referring to the drawings, the following describes the mounting system according to the first embodiment of the present invention.

<Mounting System>

FIG. 1 shows the entire construction of a mounting system 10 according to the present invention. As shown in the drawing, the mounting system 10 is composed of a plurality (here, two) of mounters 100 and 200, and a component verification apparatus 300. The mounters 100 and 200 form a production line where electronic components are mounted onto a circuit board 20 that is transported downstream. The component verification apparatus 300 optimizes the mounting order of the required electronic components at the start of production, for example, based on information in a variety of databases, and sets and controls the mounters 100 and 200 having provided them with the NC data produced by the optimization.

The mounter 100 is equipped with two stages (a front stage 110 and a rear stage 120) that operate simultaneously and independently of one another, or in concert, or even alternately. Each of these stages 110 and 120 is a perpendicular robotic mounting stage and includes two component supplying units 115a and 115b, a line gang pickup head 112, an XY robot 113, a component recognizing camera 116, a tray supplying unit 117, and an IC tag reader/writer 111. The component supplying units 115a and 115b are each made up of an array of up to 48 component cassettes 114 that store component tapes. The line gang pickup head 112 has 10 pickup nozzles (hereafter simply "nozzles") that can pick up a maximum of 10 components from the component cassettes 114 and mount them onto the circuit board 20. The XY robot 113 moves the line gang pickup head 112. The component recognizing camera 116 investigates the picked-up state of the components that have been picked up by the line gang pickup head 112 in two or three dimensions. The tray supplying unit 117 supplies tray components. The IC tag reader/writer 111 reads, from an IC tag, information stored therein and writes information to the IC tag. An IC tag is attached to a reel around which a component tape is wound. The front and rear stages mount components onto a board independently of or in parallel with the other stage.

In this specification, the expression "component tape" refers to a tape (a carrier tape) in which a number of the same type of components have been arranged, with such tape being supplied from a reel (a supply reel) or the like around which the tape has been wound. Component tapes are usually used to supply relatively small components called "chip components" to a mounter. However, during the optimization process, a "component tape" refers to data that specifies a group of components of the same type that are assumed to have been arranged on a virtual tape. In the process called "component division", a group of components of the same type (that would potentially be arranged on a single component tape) are divided into a plurality of component tapes. Note that the expression "component type" refers to a type of electronic components such as resistor and condenser, and that components supplied by a component tape are sometimes called "taped components".

In more detail, the mounter 100 is a mounting device that includes the functions of both a mounting device commonly called a high-speed mounter and a mounting device called a multi-function mounter. A high-speed mounter is a device that is capable of mounting electronic components that are 10 mm$^2$ or smaller in around 0.1 seconds per component, while a multi-function mounter is a device that can mount large electronic components that are 10 mm$^2$ or larger, irregularly shaped components like switches and connectors, and IC components like QFP (Quad Flat Package) or BGA (Ball Grid Array) components.

In short, the mounter 100 is designed so as to be able to mount almost all types of electronic components from 0.6 mm by 0.3 mm chip resistors to 200 mm connectors, with a production line being formed by arranging the required number of mounters 100 in a line.

<Construction of the Mounter>

Figure 2:
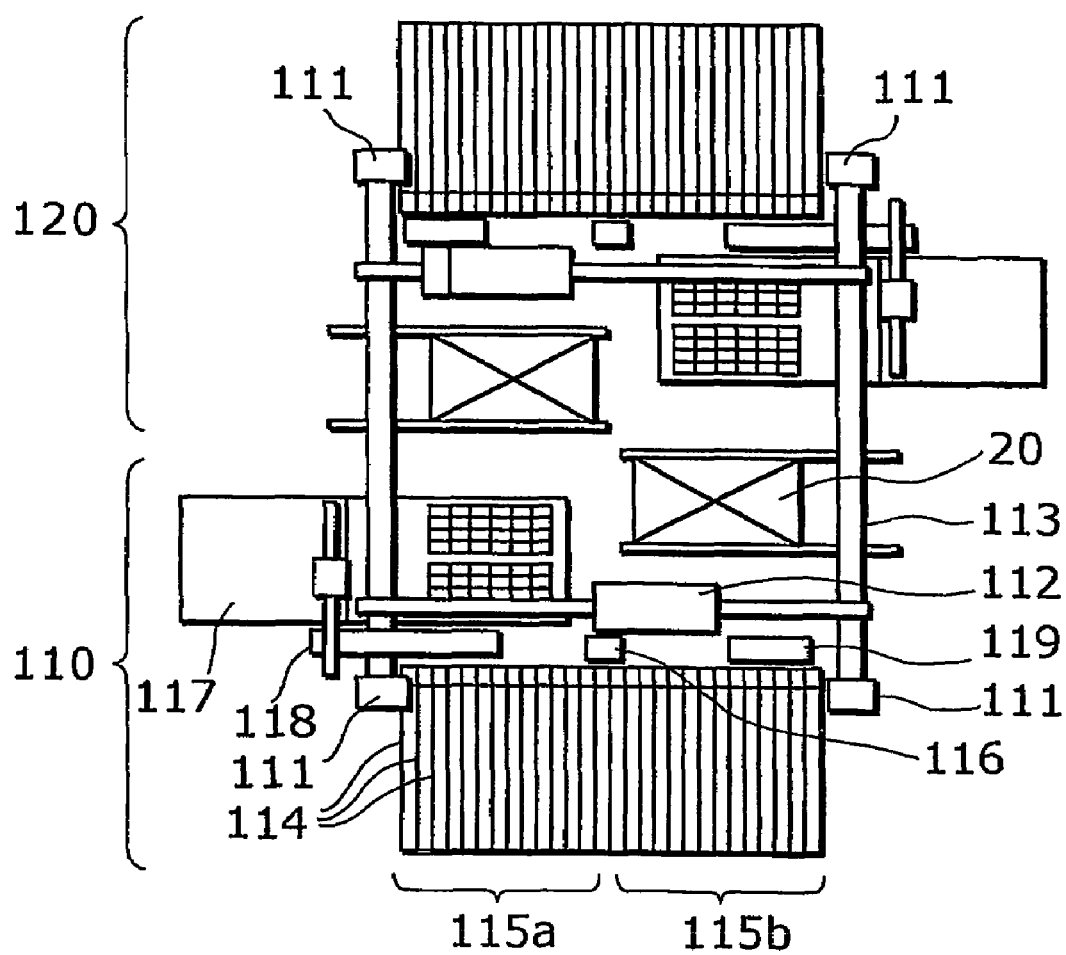
FIG. 2 is an overhead view showing the overall construction of a mounter used in the component mounting system according to the first embodiment of the present invention.

FIG. 2 is an overhead view showing the overall construction of the mounter 100.

A shuttle conveyor 118 is a moving table (a component carrying conveyor) on which a component taken from the tray supplying unit 117 is placed and which is moved to a predetermined position where the line gang pickup head 112 can pick up components from the shuttle conveyor 118. A nozzle station 119 is a table on which interchangeable nozzles corresponding to various sizes of components are positioned.

The component supplying units 115a and 115b included in each stage 110 and 120 are provided on the left and right sides of the component recognizing camera 116. The line gang pickup head 112 picks up components from the component supplying unit 115a or 115b, passes by the component recognizing camera 116, and then repeats an operation whereby the line gang pickup head 112 moves to a mounting point on the circuit board 20 and mounts one of the picked-up components. Note that the expression "mounting point" refers to a coordinate point on a board on which a component should be mounted, and that it is possible that components of the same component type are mounted on different points. The total number of components (mounting points) to be arranged on a component tape for a certain component type equals the number of components belonging to such component type (the total number of components that should be mounted).

In this specification, one iteration of the repeated series of processes where the line gang pickup head 112 picks up, transports, and mounts components and the group of components handled in such iteration are both referred to as a "task". As one example, when the line gang pickup head 112 has ten nozzles, the maximum number of components that can be mounted by a single task is ten. It should also be noted that a "pickup operation" refers to all of the operations performed from when the head starts to pick up components to when the line gang pickup head 112 transports the components. In this specification, a pickup operation refers not only to when ten components are picked up by the line gang pickup head 112 with a single nozzle stroke (a raising and lowering of the line gang pickup head 112), but also when ten components are picked using several nozzle strokes.

The stages 110 and 120 are each equipped with one or two IC tag readers/writers 111. The IC tag reader/writer 111 transmits, to an IC tag, radio waves at a predetermined frequency including a read command and receives, from the IC tag, radio waves at a predetermined frequency including information stored in such IC tag. The position of an IC tag is specified according to directions of radio waves received by the respective two IC tag readers/writers 111.

Figure 3:
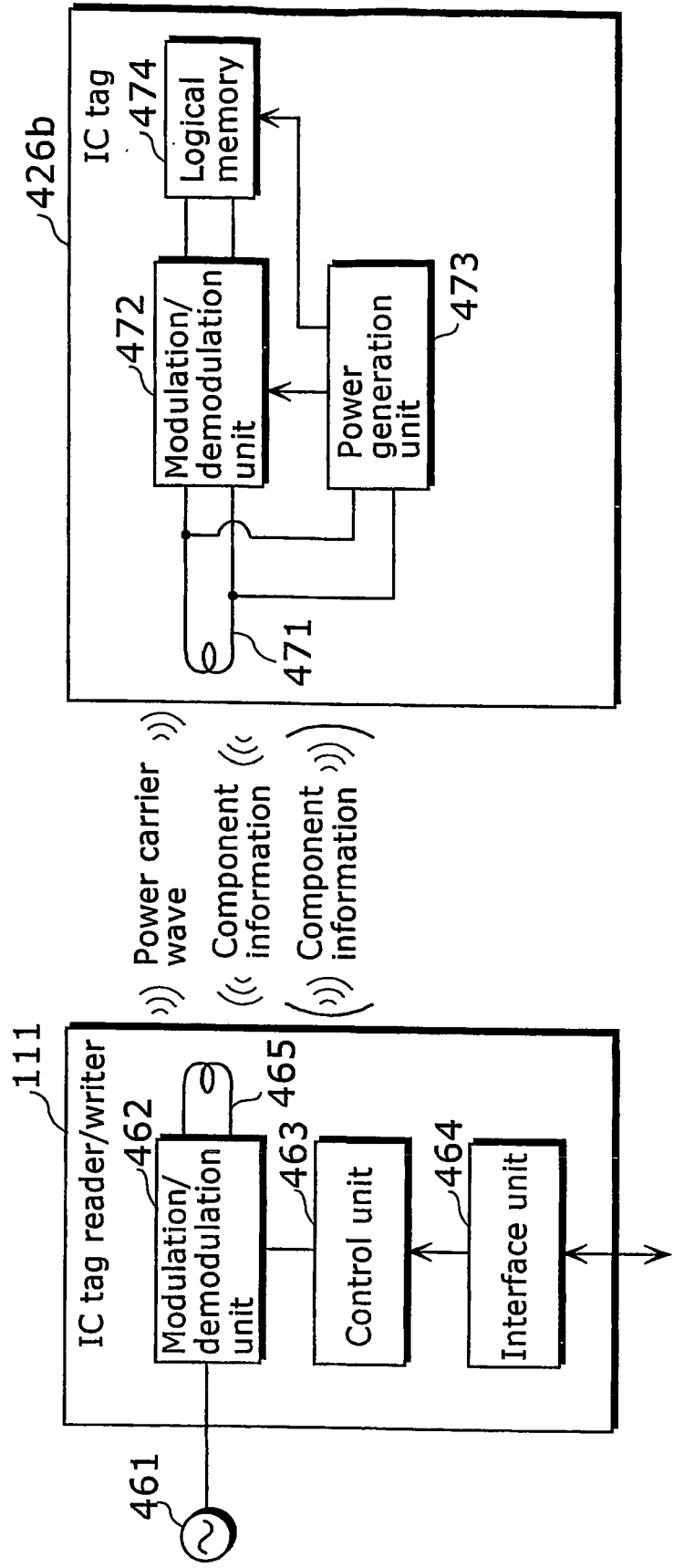
FIG. 3 is a diagram showing a circuitry of an IC tag reader/writer and an IC tag according to the first embodiment of the present invention.

FIG. 3 is a diagram showing a circuitry of an IC tag reader/writer 111 and a circuitry of an IC tag.

The IC tag reader/writer 111 is formed of a modulation/demodulation unit 462 that is connected to an AC source 461, a control unit 463, an interface unit 464, and an antenna 465.

The modulation/demodulation unit 462, which is a circuit that communicates with an IC tag 426b via the antenna 465, transmits a power carrier wave to the IC tag 426b and receives component information from such IC tag 426b. More specifically, the modulation/demodulation unit 462 generates a power carrier signal at a radio frequency (RF: 13.56 MHz, for example) while receiving a control code outputted by the control unit 463, converts such signal into a power carrier wave and transmits the resulting signal via the antenna 465. Furthermore, the modulation/demodulation unit 462 receives information that should be written to the IC tag 426b via the antenna 465.

The control unit 463 controls the modulation/demodulation unit 462 so as to make it transmit a power carrier wave and stop such transmission, as well as outputting component information received by the modulation/demodulation unit 462 to outside via the interface unit 464.

An IC tag 426b is formed of an antenna 471, a modulation/demodulation unit 472, a power generation unit 473, and a logical memory 474 which stores component information.

The power generation unit 473 receives, via the antenna 471, a power carrier wave transmitted from the IC tag reader/writer 111, in accordance with electromagnetic induction type or electromagnetic coupling type, and generates high-frequency induced power. Furthermore, the power generation unit 473 rectifies the induced power, smoothes the voltage of such rectified induced power to a certain value, and accumulates direct current power, as well as continuously supplying generated direct current power to the modulation/demodulation unit 472 and the logical memory 474 while the antenna 471 is receiving a power carrier wave.

The modulation/demodulation unit 472 converts component information stored in the logical memory 474 into electric waves, and outputs the resultant to outside via the antenna 471. Note that it is possible to employ an arbitrary modulation method such as ASK (Amplitude Shift Keying) and FSK (Frequency-Shift Keying) as long as it is paired with a demodulation method employed by the modulation/demodulation unit 462 of the IC tag reader/writer 111. Furthermore, the modulation/demodulation unit 472 demodulates the component information transmitted from the IC tag reader/writer 111 and writes the resultant into the logical memory 474.

Figure 4:
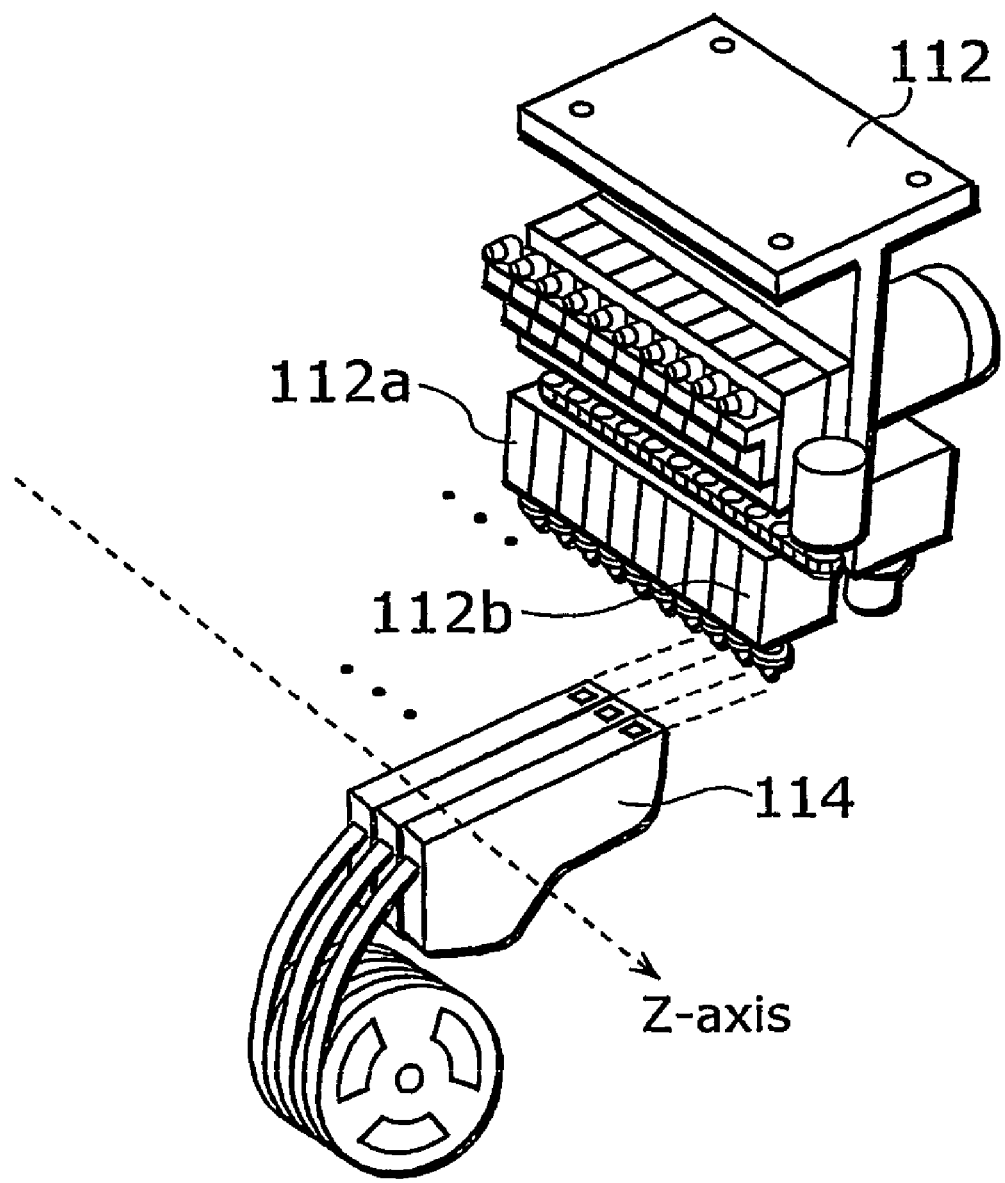
FIG. 4 is a diagram showing the positional relationship between a line gang pickup head of a mounter and component cassettes according to the first embodiment of the present invention.

FIG. 4 is a depiction of the positional relationship between the line gang pickup head 112 and the component cassettes 114. The line gang pickup head 112 uses a method referred to as "gang pickup" and can be equipped with a maximum of ten pickup nozzles 112a-112b. When thus equipped, a maximum of ten components can be simultaneously picked up from the component cassettes 114 in a single nozzle stroke (one raising and lowering of the line gang pickup head 112).

Note that only one component tape is loaded into a "single cassette" component cassette 114, while two component tapes are loaded into a "double cassette" component cassette 114. The position of each component cassette 114 (or component tape) in a component supplying unit 115a or 115b is indicated using a value in the Z-axis or a position on the Z-axis, with consecutive values being assigned to positions starting with the leftmost position in the component supplying unit 115a as position "1". As a result, the determination of mounting order for taped components amounts to the determination of the ordering (i.e., positioning on the Z-axis) of components (or component tapes, or component cassettes 114 in which the component tapes have been loaded). Here, "Z-axis" refers to a coordinate axis (or coordinate values thereon) to specify arrangement positions of component cassettes that are placed for each mounter (stage when it is equipped).

As shown in FIG. 5A, the component supplying units 115a, 115b, 215a, and 215b are each capable of storing a maximum of 48 component tapes, with the positions in these component supplying units being respectively numbered Z1 to Z48, Z49 to Z96, Z97 to Z144, and Z145 to Z192. As shown in FIG. 5B, by using double cassette feeders that can store two 8 mm-wide component tapes, each component supplying unit (A block to D block) can supply a maximum of 48 types of components. The wider the component tapes (component cassettes) used in a component supplying unit, the lower the number of feeders that can be loaded into a single block.

Note that in this specification, the leftmost component supplying units 115a and 215a (Block A and Block C) in each stage are referred to as the "left blocks", while the rightmost component supplying units 115b and 215b (Block B and Block D) in each stage are referred to as the "right blocks".

Figures 6A, 6B:
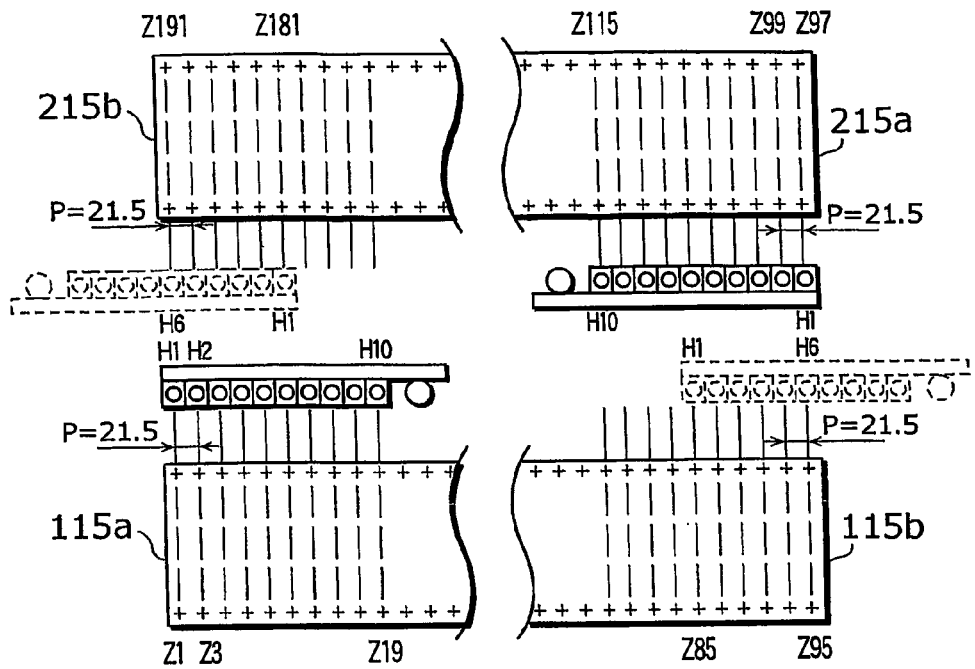
FIG. 6A is a diagram showing examples of the positions in the Z-axis of component supplying units where components can be picked up by the line gang pickup head with ten nozzles according to the first embodiment of the present invention.
FIG. 6B is a table for explaining the positions in the Z-axis shown in FIG. 6A.
Figure 7A:
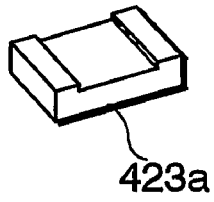
FIGS. 7A to 7D are diagrams showing various chip-shaped electronic components to be mounted according to the first embodiment of the present invention.
Figure 7B:
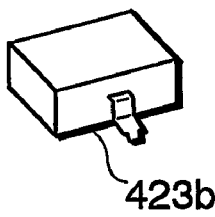
Figure 7C:
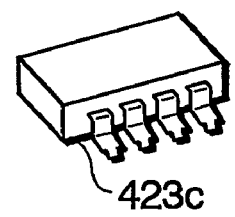
Figure 7D:
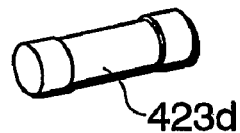

FIGS. 6A and 6B are a drawing and table showing examples of the positions in the Z-axis of component supplying units where components can be picked up by a line gang pickup head with ten nozzles. Note that the values given as H1 to H10 in these drawings represent the positions of the ten nozzle heads.

The intervals between the nozzle heads are equivalent to the width (21.5 mm) of one double-cassette feeder, so that the Z numbers of the components that can be picked up in a single nozzle stroke are two numbers apart (i.e., either all odd or all even). Due to the restrictions on the movement of a line gang pickup head with ten nozzles in the Z-axis, there are cases where certain nozzles are incapable of picking up components positioned near the ends of the component supplying units. Such cases are indicated by the "–" marks in FIG. 6B.

The following describes the construction of a component cassette 114 in detail, with reference to FIGS. 7A to 9.

Figure 8:
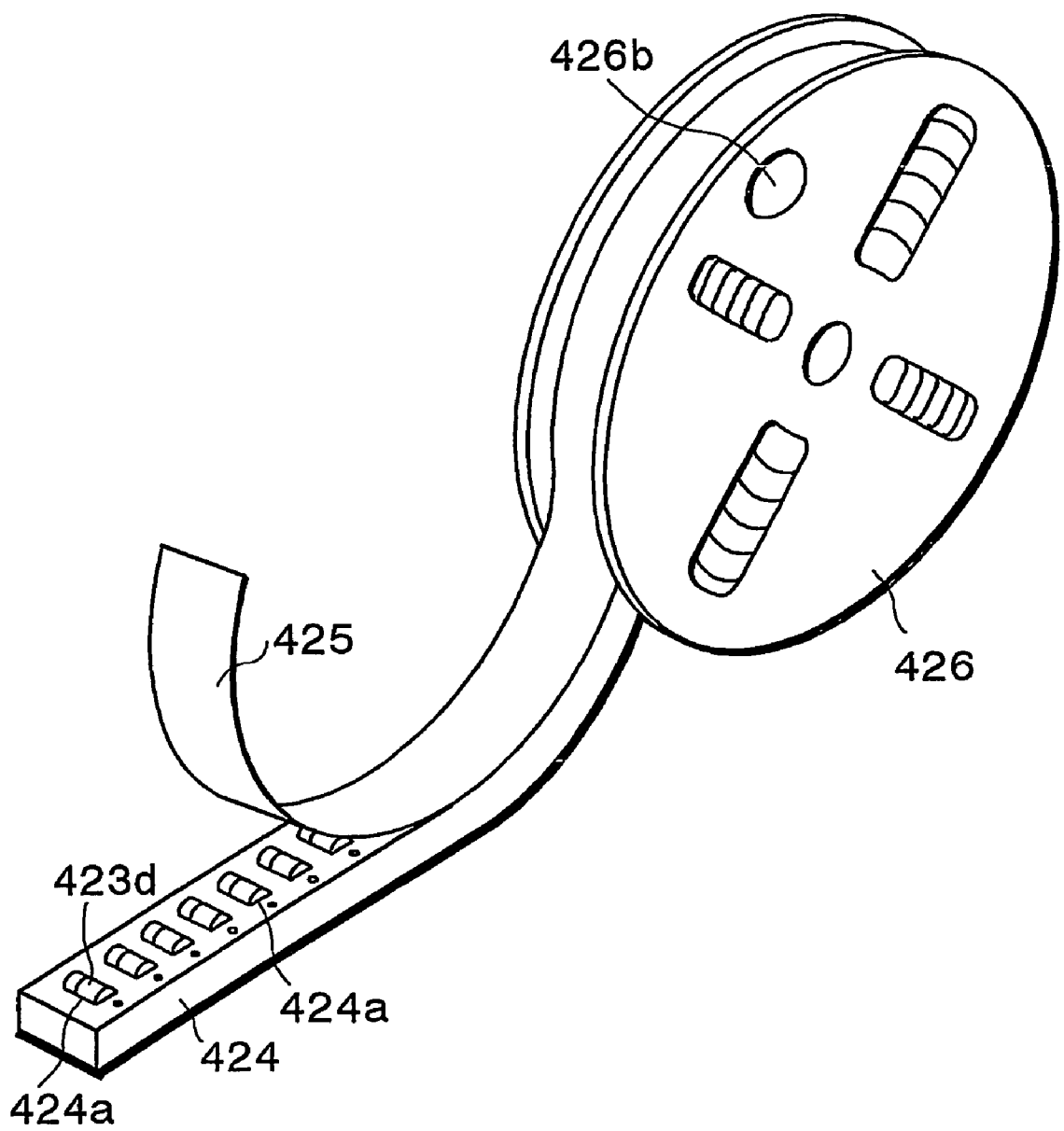
FIG. 8 is a diagram showing one example of a carrier tape that holds components and a supply reel for this carrier tape according to the first embodiment of the present invention.

FIGS. 7A to 7D show various chip-shaped electronic components 423a to 423d. As shown in FIG. 8, components 423d are placed into concave-shaped storage spaces 424a that are successively formed in a carrier tape 424 and are encapsulated by applying a cover tape 425 over the carrier tape 424. A predetermined length of this carrier tape 424 is wound around the supply reel 426, and the result is supplied to users as a component tape. Note, however, that the shape of areas in which electronic components are stored is not limited to a concave shape. A carrier tape 424 and a cover tape 425 as described above make up a component tape, and this component tape and a supply reel 426 serve as a tool for holding electronic components.

The supply reel 426 is attached with an IC tag 426b in which the following are stored: the component name of the taped components; the number of the taped components; manufacturing information such as manufacturer's name, manufacturing facility name, manufacturing date and lot name; and other information such as component size, the width of the component cassette 114 into which the carrier tape 424 is loaded and pitch with which the storage areas 424a are formed. Note that the carrier tape 424 shown in FIG. 8 may be substituted by an adhesive tape on which components are fixed adhesively as well as a paper tape.

Figure 9:
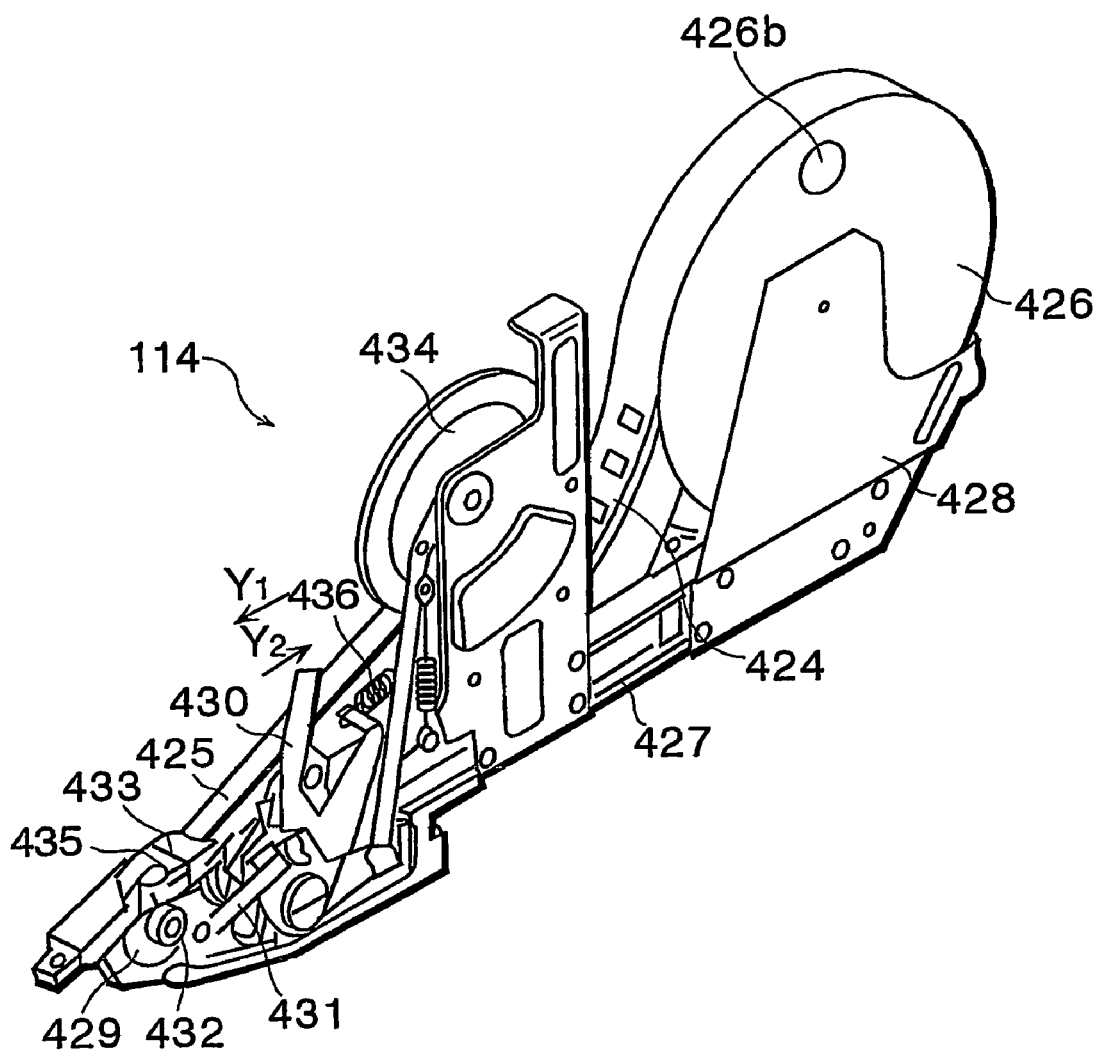
FIG. 9 is a diagram showing an example of a component cassette in which taped electronic components have been loaded according to the first embodiment of the present invention.

Taped components such as electronic component 423d are used having first been loaded into a component cassette 114, such as that shown in FIG. 9. In FIG. 9, the supply reel 426 is attached to reel side plates 428 so as to be freely rotatable, with the reel side plates 428 engaging a main frame 427. Carrier tape 424 that has been pulled off the supply reel 426 is guided by a feed roller 429. An automatic electronic component mounting apparatus (not illustrated) in which this electronic component supplying apparatus has been fitted operates as follows. Movement of a feed lever (not illustrated) also fitted in the apparatus causes a feed lever 430 of the electronic component supplying apparatus to move in the direction shown as $Y_1$ in FIG. 9. This movement is transmitted via a link 431 and results in a ratchet 432 rotating by a predetermined angle. The feed roller 429 is disposed so as to move in conjunction with the ratchet 432, and so moves by a fixed pitch, such as a feed pitch of 2 mm or 4 mm. Note that the carrier tape 424 may be fed from the reel by a motor drive or a cylinder drive.

The cover tape 425 is peeled off the carrier tape 425 by a cover tape separating unit 433 that is positioned before the feed roller 429 (towards the supply reel 426). The separated cover tape 425 is wound around a cover tape collecting reel 434 and the carrier tape 424 from which the cover tape 425 has been removed is transported to the electronic component removing unit 435. At the same time as the carrier tape 424 is fed by the feed roller 429, the electronic component removing unit 435 opens in conjunction with the movement of the ratchet 432, and a vacuum suction head (not illustrated) picks up a chip-shaped electronic component 423d using suction, thereby removing it from a storage space 424a. After this, the pressing force applied by the feed lever of the apparatus is removed and the force applied by a tension spring 436 causes the feed lever 430 to move in the direction shown as $Y_2$ in FIG. 9. As a result, the feed lever 430 returns to its original position.

The above series of operations is repeated and the spent carrier tape 424 is discharged to the outside of the electronic component supplying apparatus.

The characteristic operations of the mounter 100 are as follows.

(1) Nozzle Interchanging

When a nozzle that is required for the next mounting operation is not present on the line gang pickup head 112, the line gang pickup head 112 is moved to the nozzle station 119 where nozzle interchanging is performed. The types of nozzles available depend on the sizes of the components to be picked up by the line gang pickup head 112. As one example, "type S", "type M", and "type L" nozzles may be provided.

(2) Component Pickup

The line gang pickup head 112 moves to the component supplying units 115a and 115b and picks up electronic components using suction. When ten components cannot be simultaneously picked up, the line gang pickup head 112 may be repositioned and may make several nozzle strokes to pick up a maximum of ten electronic components.

(3) Recognition Scan

The line gang pickup head 112 moves past the component recognizing camera 116 at a predetermined speed. The component recognizing camera 116 forms images of all of the electronic components that have been picked up by the line gang pickup head 112 and detects whether the components have been picked up at the correct positions.

(4) Component Mounting

Electronic components are successively mounted on the circuit board 20.

The above operations (1) to (4) are repeated, thereby mounting all of the required electronic components onto the circuit board 20. The operations (2) to (4) form the main operation of the mounter 100 when mounting components and correspond to a "task". This means that a maximum of ten electronic components can be mounted on a substrate in a single task.

<Restrictions for the Mounter>

The object when optimizing the order of mounting for components is to maximize the number of substrates that can be processed by the mounter 100 per unit time. As can be understood from the functional and operational characteristics of the mounter 100 that are mentioned above, a favorable optimization method (optimization algorithm) is one that selects ten electronic components that can be efficiently mounted onto a substrate, simultaneously picks up all ten from a component supplying unit, and then successively mounts the electronic components using the shortest possible route. The order of component mounting determined by such an optimization algorithm will ideally result in ten times the productivity of the case where a mounter is only equipped with one nozzle.

However, due to factors such as device construction, cost, and operability, every mounter is subject to certain restrictions regarding the order in which components can be mounted. More realistically, the optimization of the order of component mounting is therefore the maximization of the number of substrates that can be processed by the mounter per unit time, subject to various restrictions.

The following describes the main restrictions to which the mounter 100 is subject. Note that these restrictions are also described in detail later in this specification where separate optimization algorithms are being discussed.

<Line Gang Pickup Head>

The line gang pickup head 112 has ten mounting heads that can independently pick up and mount electronic components arranged in a line. A maximum of ten pickup nozzles can be attached, so that a maximum of ten components can be picked up in a single nozzle stroke by the line gang pickup head 112.

Each of the heads (a part capable of picking up one component) that compose the line gang pickup head 112 is referred to in this specification as a "mounting head" or simply as a "head".

The ten mounting heads that form the line gang pickup head 112 are arranged in a straight line, which places a restriction on the movable range of the line gang pickup head 112, both when picking up components and when mounting components. In more detail, as shown in FIG. 6B, there are restrictions as to which mounting heads are able to access components that are located at either end of a component supplying unit (which is to say, near the left end of the left component supplying unit 115a and near the right end of the right component supplying unit 115b).

When mounting electronic components onto a substrate, there are also restrictions on the movable range of the line gang pickup head 112.

<Component Recognizing Camera>

As the component recognizing camera 116, the mounter 100 is equipped with a 2D camera that forms two-dimensional images and a 3D camera that can also detect height. As the 2D camera, a 2DS camera and 2DL camera are provided for use, depending on the size of the area to be photographed. The 2DS camera is capable of photographing a small area at high speed, and is characterized by having maximum field of 60 mm by 220 mm. The 3D camera is used to detect in three dimensions whether any of the leads of an IC component are bent.

The recognition scanning speed used when photographing electronic components differs depending on the camera being used. When components that are photographed by the 2DS camera and components that are photographed by the 3D camera are present in the same task, recognition scanning needs to be performed at the scanning speed of each camera, making two scanning operations necessary.

<Component Supplying Units>

Electronic components may be packaged in the form of a component tape, where components are held by a tape, or in the form of a tray in the form of a plate whose area is partitioned in keeping with the dimensions of components.

The supply of taped components is performed by the component supplying units 115a and 115b, while the supply of tray components is performed by the tray supplying unit 117.

The taping of electronic components is standardized, and tapes with widths of 8 mm to 72 mm are available for different-sized components. By setting components that are held by a tape (or in other words, a "component tape") in a component cassette (a "tape feeder unit") with a suitable width for the tape width, electronic components can be reliably and consecutively obtained from the tape.

The component supplying units in which component cassettes are set are designed so that component tapes with a width of up to 12 mm can be loaded with no gaps at a pitch of 21.5 mm. When the width of the tape is 16 mm or above, tapes need to be set leaving an appropriate gap that depends on the width of the tape. In order to pick up a plurality of electronic components simultaneously (i.e., in a single nozzle stroke for the line gang pickup head 112), the mounting heads and component cassettes should be aligned with the same pitch. When each component is supplied using a tape that is 12 mm wide or narrower, ten components can be simultaneously picked up by the line gang pickup head 112.

Note that the two component supplying units (the left block 115a and right block 115b) that compose each component supplying unit are each capable of holding a maximum of 48 tapes that are 12 mm wide or narrower.

<Component Cassettes>

Component cassettes can be single-cassette feeders that only hold one component tape or double-cassette feeders that hold a maximum of two cassettes. The two component tapes that are placed in the same double-cassette feeder need to have the same feed pitch (2 mm or 4 mm).

<Other Restrictions>

In addition to the above restrictions that arise due to the construction of the mounter 100, the mounter 100 is also subject to the following operation restrictions that arise due to the production facility in which the mounter 100 is being used.

(1) Fixed Arrangements

As one example, in order to reduce the amount of labor required to replace component tapes, there are cases where a particular component tape (or the component cassette that holds this component tape) is set at a fixed position (a position on the Z-axis) within a component supplying unit.

(2) Restrictions on Resources

There are cases where the number of component tapes that are provided for the same type of components, the number of feeders used to hold component tapes, the number of double-cassette feeders, and the number of nozzles (of each type) are subject to certain restrictions.

<Component Verification Apparatus>

The component verification apparatus 300 is intended for verifying if component cassettes 114 holding component tapes are correctly set in the component supplying units 115a and 115b. Furthermore, when informed of the article to be produced (the substrate and the components to be mounted upon it) and the production machinery (the mounters and stages with their limited resources), the component verification apparatus 300 determines the order of component mounting that enables the finished substrate to be produced in the shortest possible time to raise the number of substrates that can be produced per unit time.

In more detail, in order to minimize the amount of time spent mounting components on each substrate, a computer decides at what positions (Z-axis) in what mounter (stage) the component cassettes loaded with component tapes should be set, in what order the line gang pickup head of each mounter (stage) should pick up the highest possible numbers of components as possible from the component cassettes, and in what order and at which positions (mounting points) the picked-up components should be mounted on a substrate. The computer makes this decision by finding an optimal solution.

When doing so, the component verification needs to satisfy the aforementioned restrictions present with the mounters (stages) being used.

<Hardware Construction of the Component Verification Apparatus>

The component verification apparatus 300 is realized by having a standard computer system such as a personal computer execute an optimization program embodying the present invention. When not connected to an actual mounter 100, the component verification apparatus 300 can also function as a stand-alone simulator (an optimization tool for the order of component mounting).

Figure 10:
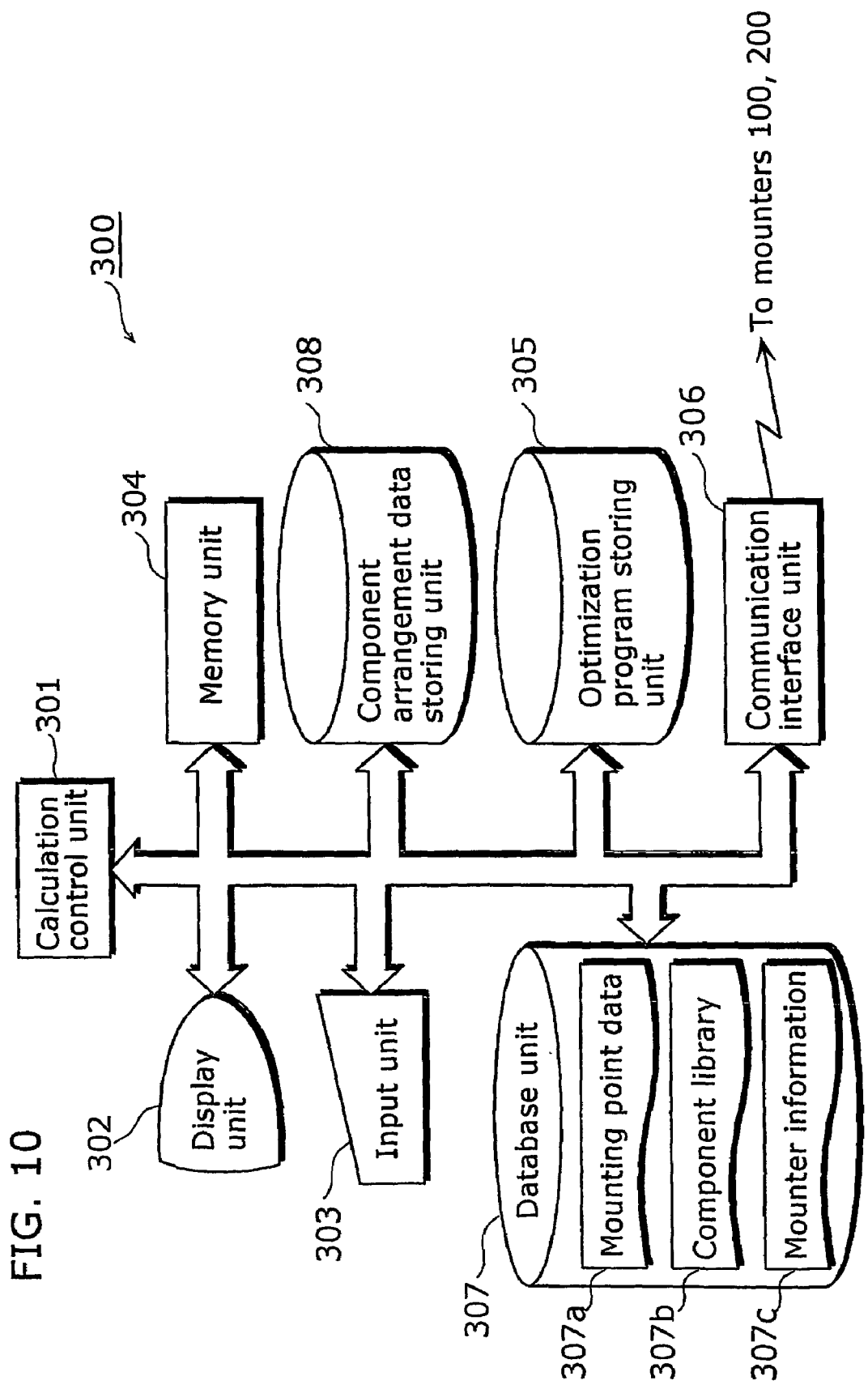
FIG. 10 is a block diagram showing the hardware construction of a component verification apparatus according to the first embodiment of the present invention.

FIG. 10 is a block diagram showing the hardware construction of the component verification apparatus 300 that was shown in FIG. 1. In order to minimize the line tact time (the highest tact time out of the individual tact times of the stages forming the production line) for the mounting of components on a substrate, the component verification apparatus 300 determines which components should be mounted by each stage and the mounting order of components for each stage, based on information for all of the components that is provided by a component mounting CAD (Computer-Aided Design) apparatus or the like. By doing so, the component verification apparatus 300 produces optimal NC data. It should be noted that in this specification, the expression "tact time" refers to the total time required to mount components.

As shown in FIG. 10, the component verification apparatus 300 includes a calculation control unit 301, a display unit 302, an input unit 303, a memory unit 304, an optimization program storing unit 305, a communication interface unit 306, a database unit 307, and a component arrangement data storing unit 308.

The calculation control unit 301 is a CPU (Central Processing Unit), a numeric processor, or the like. In accordance with instructions from the user, the calculation control unit 301 loads the required programs from the optimization program storing unit 305 into the memory unit 304 and executes them. In accordance with the execution result, the calculation control unit 301 controls the components numbered 302 to 307. Furthermore, the calculation control unit 301 obtains information related to component cassettes 114 from the mounter 100 (200), generates a component library and component arrangement data from such obtained information, and stores them into the database unit 307 and the component arrangement data storing unit 308, respectively. Processing for generating component library and component arrangement data is described later.

The display unit 302 is a CRT (Cathode Ray Tube), an LCD (Liquid Crystal Display), or the like, while the input unit 303 is an input device such as a keyboard or a mouse. These components are controlled by the calculation control unit 301 and are used to allow user interaction with the component verification apparatus 300. A specific user interface is described later using examples of screen displays.

The communication interface unit 306 is a LAN (Local Area Network) adapter or the like, and is used to allow the component verification apparatus 300 to communicate with the mounters 100 and 200.

The memory unit 304 is a RAM (Random Access Memory) or the like that provides a work area for the calculation control unit 301. The optimization program storing unit 305 is a hard disk drive or the like storing a variety of optimization programs that realize the functions of the component verification apparatus 300.

The database unit 307 is a hard disk drive or the like storing input data (mounting point data 307a, a component library 307b, and mounter information 307c) that is used in the optimization process performed by the component verification apparatus 300 and mounting point data and other data generated by the optimization process.

The component arrangement data storing unit 308 is a hard disk or the like that stores component arrangement data and the like indicating the position on the Z-axis of component tapes.

Figure 11:
FIG. 11 is a diagram showing an example of the mounting point data according to the first embodiment of the present invention.
Figure 13:
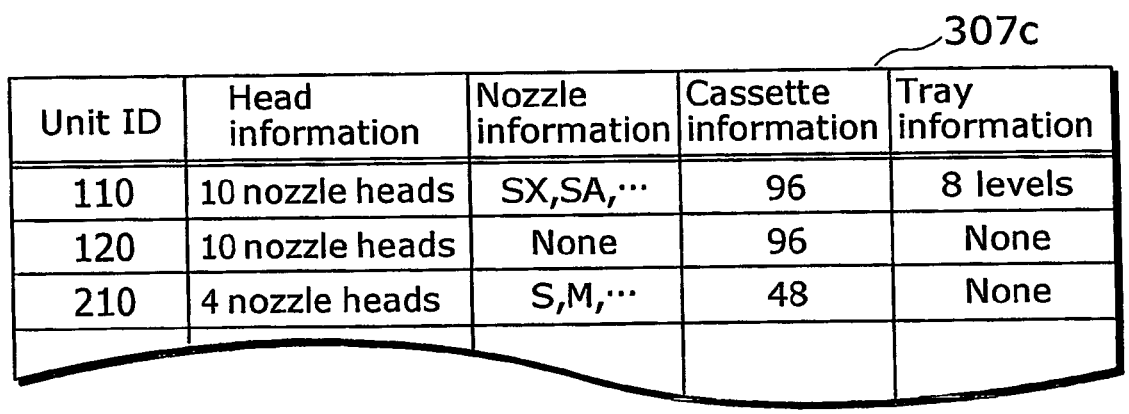
FIG. 13 is a diagram showing an example of mounter information according to the first embodiment of the present invention.

FIGS. 11 to 13 show examples of the mounting point data 307a, the component library 307b, and the mounter information 307c, respectively.

The mounting point data 307a is a collection of information showing the mounting points of all of the components to be mounted. As shown in FIG. 11, one mounting point $p_i$ is made up of a component type $c_i$, an X coordinate $x_i$, a Y coordinate $y_i$, and control data $\phi_i$. In the present case, the expression "component type" refers the name of a component in the component library 307b shown in FIG. 12, the "X coordinate" and "Y coordinate" are the coordinates of the mounting point (coordinates that indicate a specific position on a substrate), and "control data" is control information (such as the type of pickup nozzle that can be used and the maximum speed at which the line gang pickup head 112 should move) relating to the mounting of the component. It should be noted that the "NC data" that is to be finally produced is an ordered list of mounting points that results in the shortest line tact time.

The component library 307b is a library in which specific information for the various component types that can be handled by the mounters 100 and 200 is gathered together. As shown in FIG. 12, each entry in the component library 307b includes the component size, tact time (tact time for each component type subject to certain conditions), and other restriction information (such as the type of pickup nozzle that can be used, the recognition method to be used by the component recognizing camera 116, and the maximum speed at which the line gang pickup head 112 should move). It should be noted that in FIG. 12, the external appearance of components of various types have also been shown for reference purposes. Also note that the component library may include other information such as component colors and component shapes.

The mounter information 307c is information showing the constructions of each of the stages forming the production line and the restrictions to which these stages are subject. As shown in FIG. 13, the mounter information 307c is made up of information such as unit IDs indicating stage numbers, head information relating to the type of line gang pickup head, nozzle information relating to the types of nozzles that can be attached to the line gang pickup head, feeder information relating to the maximum number of component cassettes 114, and tray information relating to the number of levels on which trays are stored in the tray supplying unit 117.

The information described above is categorized as follows. The categories used are equipment option data (for each stage), resource data (the number of cassettes that can be fitted in each stage and the number of nozzles in each stage), nozzle station arrangement data (for each station equipped with a nozzle station), initial nozzle pattern data (for each stage), and Z-axis arrangement data (for each stage). It is assumed that at least 10 nozzles of each type, such as SX, SA, and S, are available as resources.

FIG. 14 is a diagram showing exemplary component arrangement data stored in the component arrangement data storing unit 308. Component arrangement data is data indicating positions on the Z-axis on which taped components should be arranged that is made up of the component names of taped components, the stage numbers (unit IDs) of stages at which these component cassettes 114 are set, and the positions of the component cassettes 114 on the Z-axis (Z numbers). Component cassettes 114 need to be arranged according to this component arrangement data.

<Z number Specification and Seam Detection>

Figure 15:
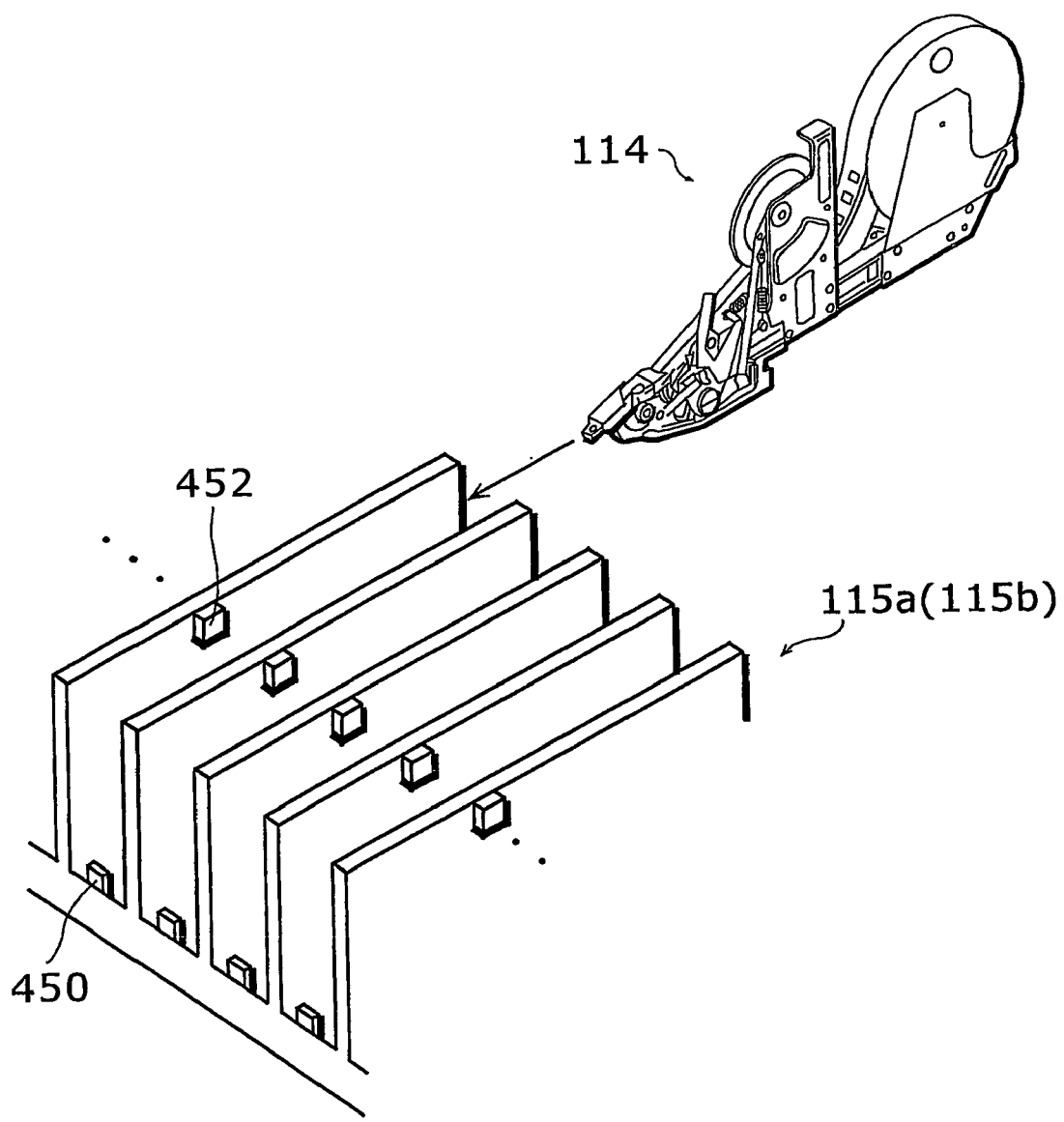
FIG. 15 is a diagram for giving more detailed descriptions of a component supplying unit according to the first embodiment of the present invention.

FIG. 15 is a diagram for giving more detailed descriptions of the component supplying units 115a and 115b. A switch 450 and a seam detection sensor 452 are provided to the component supplying units 115a and 115b on a Z number basis.

A switch 450 becomes electrically turned ON when a component cassette 114 is set on the component supplying unit 115a (115b). The component verification apparatus 300 can know the Z number of the component supplying unit 115a (115b) to which a component cassette 114 is set, based on an output from the switch 450.

Figure 16:
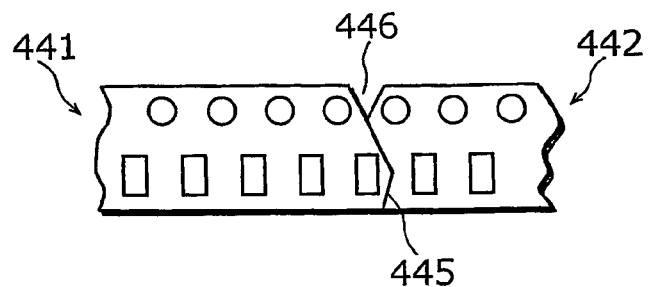
FIG. 16 is diagram showing a seam on a carrier tape according to the first embodiment of the present invention.

The seam detection sensor 452 is a sensor that optically detects a seam on the carrier tape 424. FIG. 16 is a diagram showing a seam on a carrier tape. At the time of component mounting, the trailing edge of the carrier tape 441 (424) is connected to the leading edge of another carrier tape 442 (424) before such trailing edge of the carrier tape 441 (424) comes off. By making a connection in this manner, it becomes possible to supply components without needing to terminate the mounter 100 (200). When this is done, a slit 446 appears at a point (a seam 445) where the carrier tape 441 and the carrier tape 442 are connected. The seam detection sensor 452 optically detects this slit 446. Note that the seam detection sensor 452 does not have to be a sensor using an optical detection method but it can be any sensor as long as it can detect seams.

<Z Number Specification by IC Tag>

Figure 17:
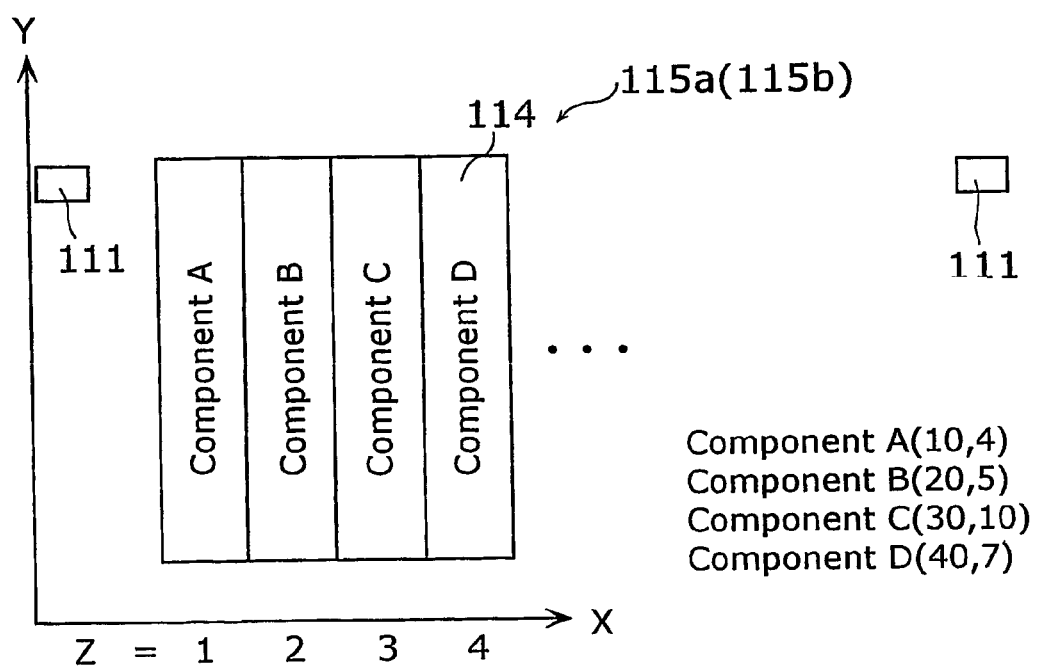
FIG. 17 is a diagram for explaining a method for specifying the Z number of a carrier tape from an IC tag according to the first embodiment of the present invention.

FIG. 17 is a diagram for explaining a method for specifying the Z number of a carrier tape 424 from an IC tag. The two IC tag readers/writers 111 specify the position of each IC tag 426b based on the direction of electric waves received from each IC tag 426b. When the position of each IC tag 426b is specified, its Z number is then specified. Here, since the two IC tag readers/writers 111 receive component name information from each IC tag 426b, the component name as well as the Z number of each component cassette 114 can be specified based on information received from each IC tag 426b. For example, as shown in FIG. 17, suppose that the Z number increases by one every time X increases by ten. If the position of a component A is specified as (X, Y)=(10, 4), it is possible to know from the X coordinate that the Z number of the component A is 1. Note that two components exist on the same Z position in the case of a double cassette, but their X coordinates are different, it is possible to know which component tape is placed at the left side/right side of the double cassette.

Note that the method of specifying the position of an IC tag 426b is not limited to a method that uses the direction of electric waves, but it can also be a method that uses the strength of electric waves received by the two IC tag readers/writers 111 or the strength ratio of electric waves. Furthermore, in the case where an IC tag 426c outputs a signal via a wireless communication medium such as electromagnetic waves, infrared rays or the like, it is also possible to specify the position of an IC tag 426b according to a state of the signal (e.g. strength/direction of the signal) when it is outputted.

Moreover, the number of IC tag readers/writers 111 does not necessarily have to be two, and thus one IC tag reader/writer 111 can do as long as it can determine the position of an IC tag 426b from the strength or direction of electric waves to be received.

Figure 18:
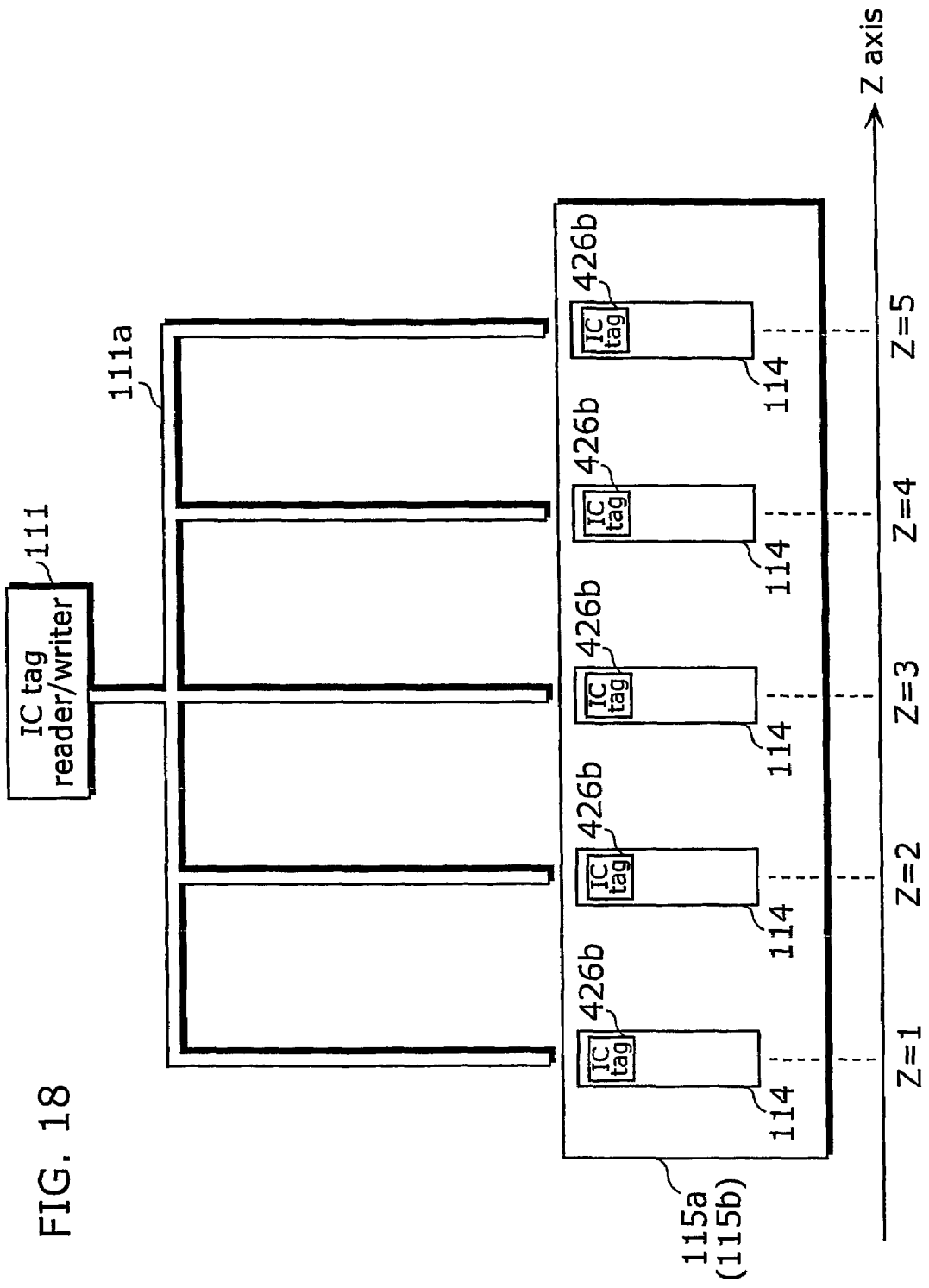
FIG. 18 is a diagram for illustrating how one IC tag reader/writer specifies the position of each IC tag according to the first embodiment of the present invention.

FIG. 18 is a diagram for illustrating how one IC tag reader/writer 111 specifies the position of each IC tag 426b.

The mounter 100 and 200 are each equipped with one IC tag reader/writer 111, and an antenna 111a that is installed so that it extends from such IC tag reader/writer 111 close to the IC tag 426b of each component cassette 114 in the component supplying units 115a and 115b.

With the antenna 111a extending close to all IC tags 426b, it becomes possible for the IC tag reader/writer 111 to receive electric waves from each of the IC tags 426b without fail. In other words, the IC tag reader/writer 111 can correctly specify the position of each IC tag 426b based on the strength and direction of the electric waves received from each IC tag 426b. Furthermore, the IC tag reader/writer 111 is also able to specify the Z number of the component cassette 114 from the position of each IC tag 426b that has been specified.

Moreover, it is also possible that an antenna extending close to each of the IC tags 426b may be equipped. In this case, each antenna corresponds to each Z number (Z=1, 2, . . . ), so that by switching between antennas to obtain an output from one of the antennas, the IC tag reader/writer 111 specifies the Z number of the IC tag 426b (component cassette 114) that corresponds to such antenna and obtains the component information from such IC tag 426b.

More specifically, each of the antennas is equipped with a switch, and when the switch is turned ON, the IC tag reader/writer 111 obtains an output from the antenna that corresponds to such switch. The IC tag reader/writer 111 switches between antennas to obtain an output by turning on the switches one by one in such a manner as that it turns on only the switch that corresponds to Z=1, from among the switches corresponding to the respective antennas, and then turns on only the switch that corresponds to Z=2.

Note that as shown in FIG. 15, a switch 450, when it is equipped, is capable of detecting that a component cassette 114 is set to the component supplying unit 115a (115b). Therefore, it is also possible to configure the present embodiment so that the Z number of a component cassette 114 is specified according to a detection result of the switch 450.

<Component Verification Processing>

Figure 19:
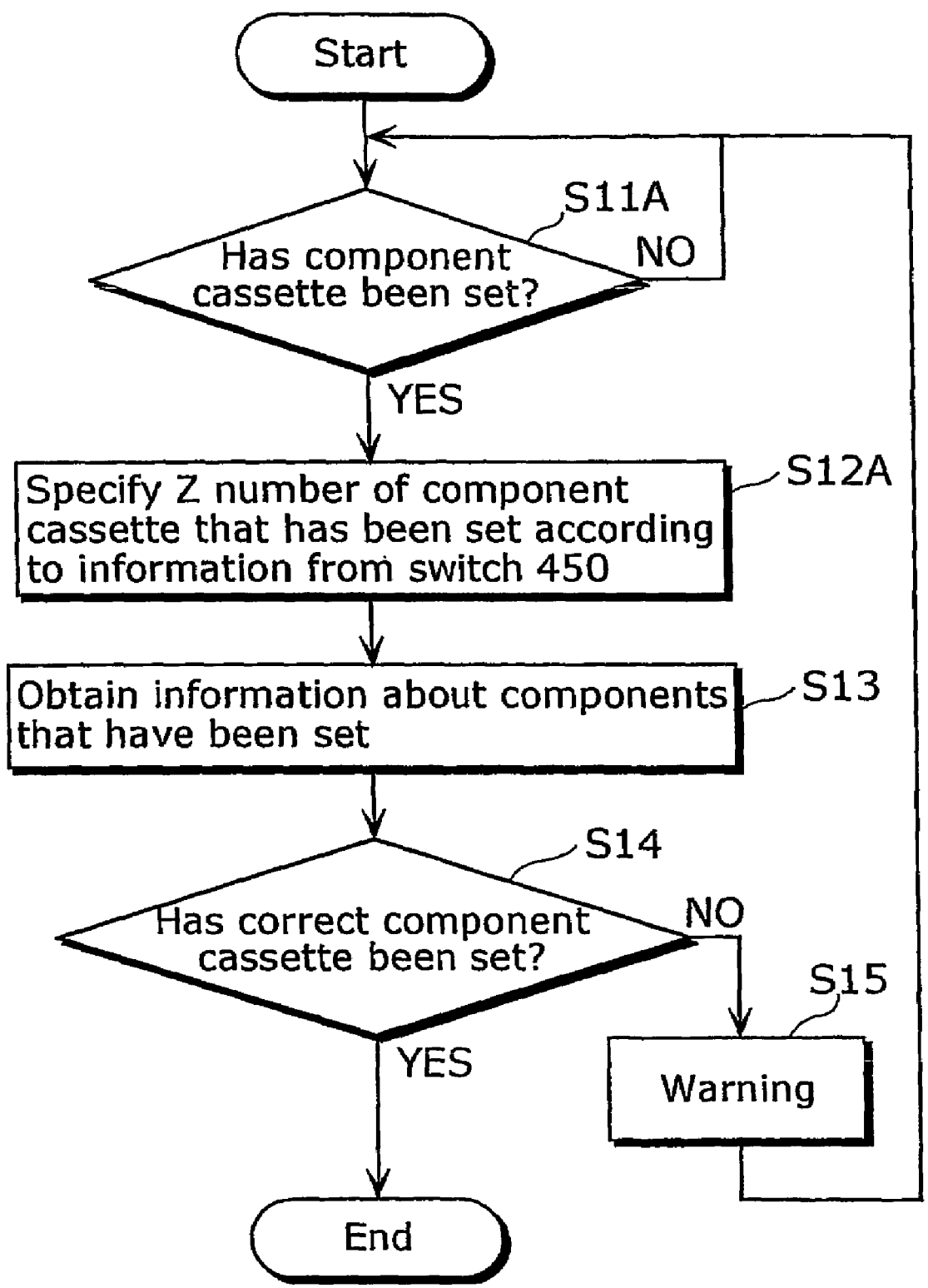
FIG. 19 is a flowchart showing component verification processing according to the first embodiment of the present invention.

FIG. 19 a flowchart showing component verification processing.

The component verification apparatus 300 checks whether a component cassette 114 holding a component tape has been set to the component supplying unit 115a/115b based on an output of the switch 450 (S11A). When a component cassette 114 is newly set to the component supplying unit 115a/115b (YES in S11A), the Z number of the newly set component cassette 114 is specified based on an output of the switch 450 (S12A). After this, one of the IC tag readers/writers 111 obtains component information from the IC tag 426b of the component tape that has been set (S13).

The component verification apparatus 300 verifies if the above-set component tape is a correct one or not (S14). In other words, the component verification apparatus 300 judges that a component tape is a correct one if the component name, unit ID, and Z number of such component tape match ones registered as an entry of the component arrangement data (prescribed component information and prescribed position information). Meanwhile, even when the component name of a component tape that has been set does not match, the component verification apparatus 300 judges that such component tape is a correct one if it includes components that can serve as alternatives to components registered as an entry of the component arrangement data. Information related to alternative components shall be written in advance in an IC tag 426b. Furthermore, such information may also be registered as an entry of either the component verification data or the component library.

If the component tape is a wrong one (NO in S14), the component verification apparatus 300 issues a warning (S15) and then returns to processing to check if any component cassettes have been set or not (S1). If a correct component cassette has been set (YES in S14), the component verification processing is terminated.

As described above, it is possible to verify if correct components have been set to the component supplying units 115a/115b at the time when a component cassette has been set to the component supplying units, prior to the commencement of component mounting. As a result, it becomes possible to prevent wrong components from being mounted, as well as to do with only one IC tag reader/writer 111.

In the component verification processing shown in FIG. 19, the Z number of each component cassette 114 is specified based on an output of the switch 450. Therefore, in the case of a double cassette, it is impossible to correctly specify the position of each component tape. Moreover, in the case where plural component cassettes have been simultaneously set in a collective manner, it is impossible to specify the position of each component tape. For this reason, the present embodiment may be configured so that the position of each component tape can be specified by use of the IC tag readers/writers 111.

Figure 20:
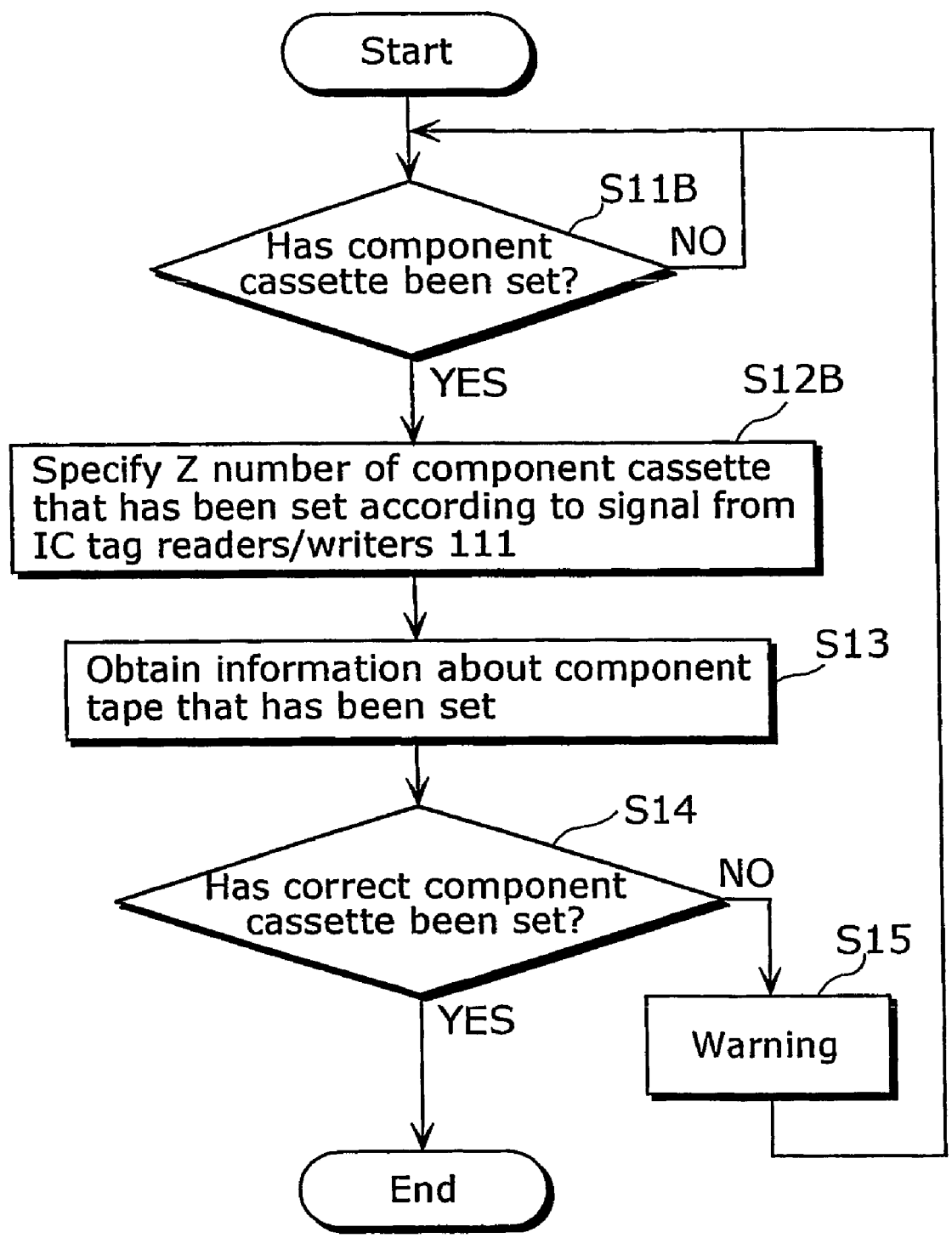
FIG. 20 is a flowchart showing a variation of the component verification processing according to the first embodiment of the present invention.

FIG. 20 is a flowchart showing a variation of the component verification processing shown in FIG. 19. The component verification apparatus 300 checks if a component cassette 114 holding a component tape has been set to the component supplying unit 115a/115b, by use of two IC tag readers/writers 111 (S11B). In other words, as explained by reference to FIG. 17, the position of the component cassette 114, to which an IC tag 426b is attached, is specified by checking the position of such IC tag 426b using the two IC tag readers/writers 111. When a component cassette 114 is newly set to the component supplying unit 115a/115b (YES in S11B), the Z number of the newly set component cassette 114 is specified by the two IC tag readers/writers 111 (S12B). The subsequent processes are the same as those shown in FIG. 19, and therefore detailed descriptions thereof are not repeated here. Note that in the case of a double cassette, the use of the two IC tag readers/writers 111 makes it possible to check whether or not information stored in one of the right and left sides of the cassette matches the component arrangement data. Furthermore, the provision of a switch 450 is not mandatory.

<Component Verification Processing at Tape Connection Time>

Figure 21:
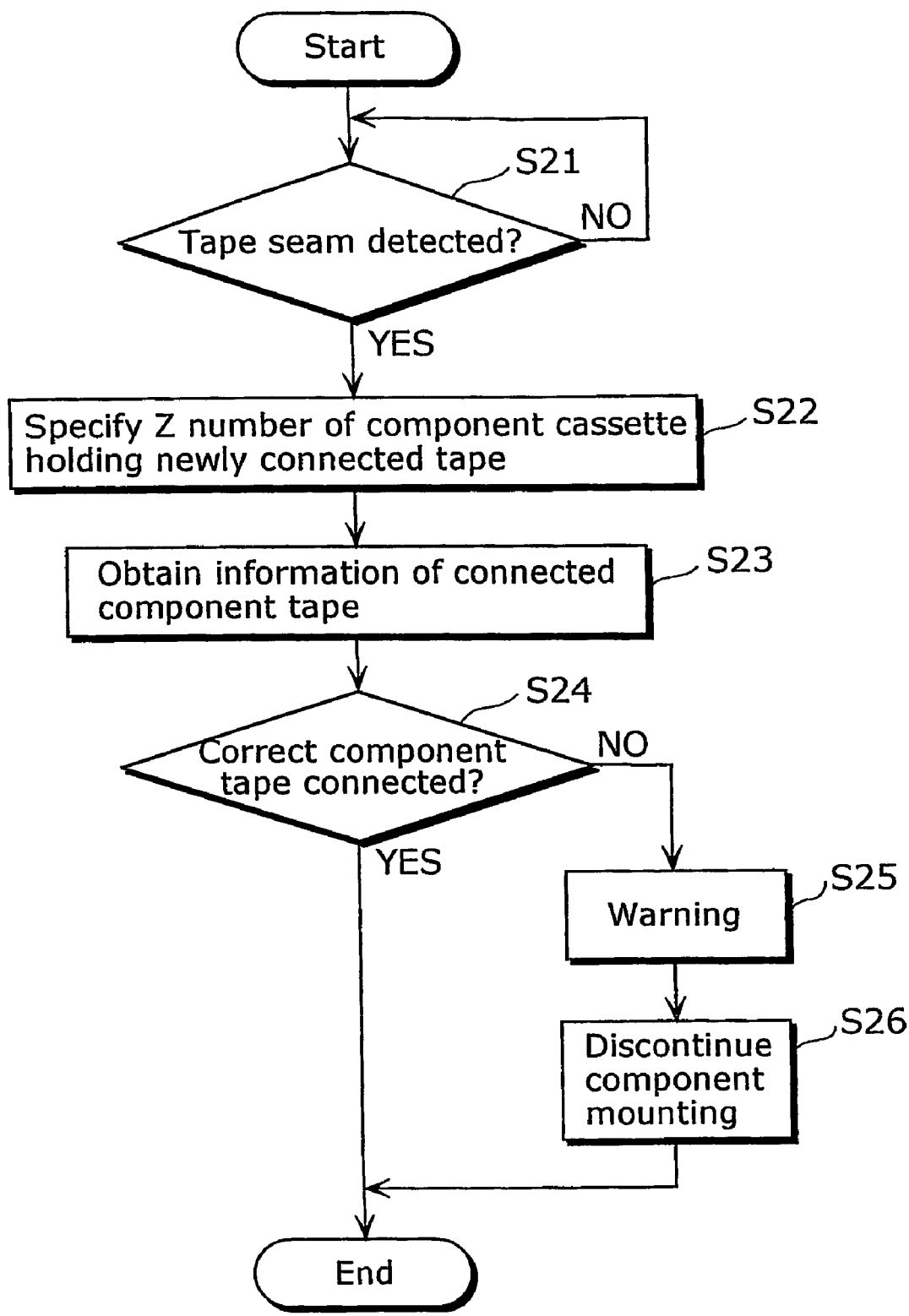
FIG. 21 is a flowchart showing component verification processing to be performed at the time of connecting component tapes according to the first embodiment of the present invention.

FIG. 21 is a flowchart showing component verification processing to be performed at the time of connecting component tapes. When a component tape is becoming low, it becomes necessary to connect the trailing edge of such component tape to the leading edge of a new component tape. When this is done, the present program is executed so as to prevent a wrong component tape from being connected. Note that the present program, which is activated after component mounting processing is started, is executed in parallel with the program for component mounting processing.

The component verification apparatus 300 waits for the seam detection sensor 452 to detect a seam on the carrier tape 424 (S21). When a seam is detected (YES in S21), the Z number of a component cassette that holds the newly connected component tape is specified (S22). The Z number is specified based on an output of the seam detection sensor 452. After this, the two IC tag readers/writers 111 obtain component information from the IC tag 426*b* of the newly connected component tape (S23).

The component verification apparatus 300 verifies if the newly connected component tape is a correct one or not based on its component information (S24). The component verification apparatus 300 judges whether the component tape is a correct one or not in the same manner as for the component verification processing (S14) shown in FIG. 19. If the connected component tape is a correct one (YES in S24), the component verification apparatus 300 performs no processing, whereas if the connected component tape is a wrong one (NO in S24), it issues a warning (S25), and then terminates the component mounting processing so as to prevent the components held by such wrong component tape from being taken out (S26).

As described above, even when a wrong component tape is connected, it is possible to terminate component mounting processing before the components included in such wrong component tape are actually mounted. Accordingly, it is possible to improve product yields.

<Manufacturing Information Write Processing>

Figure 22:
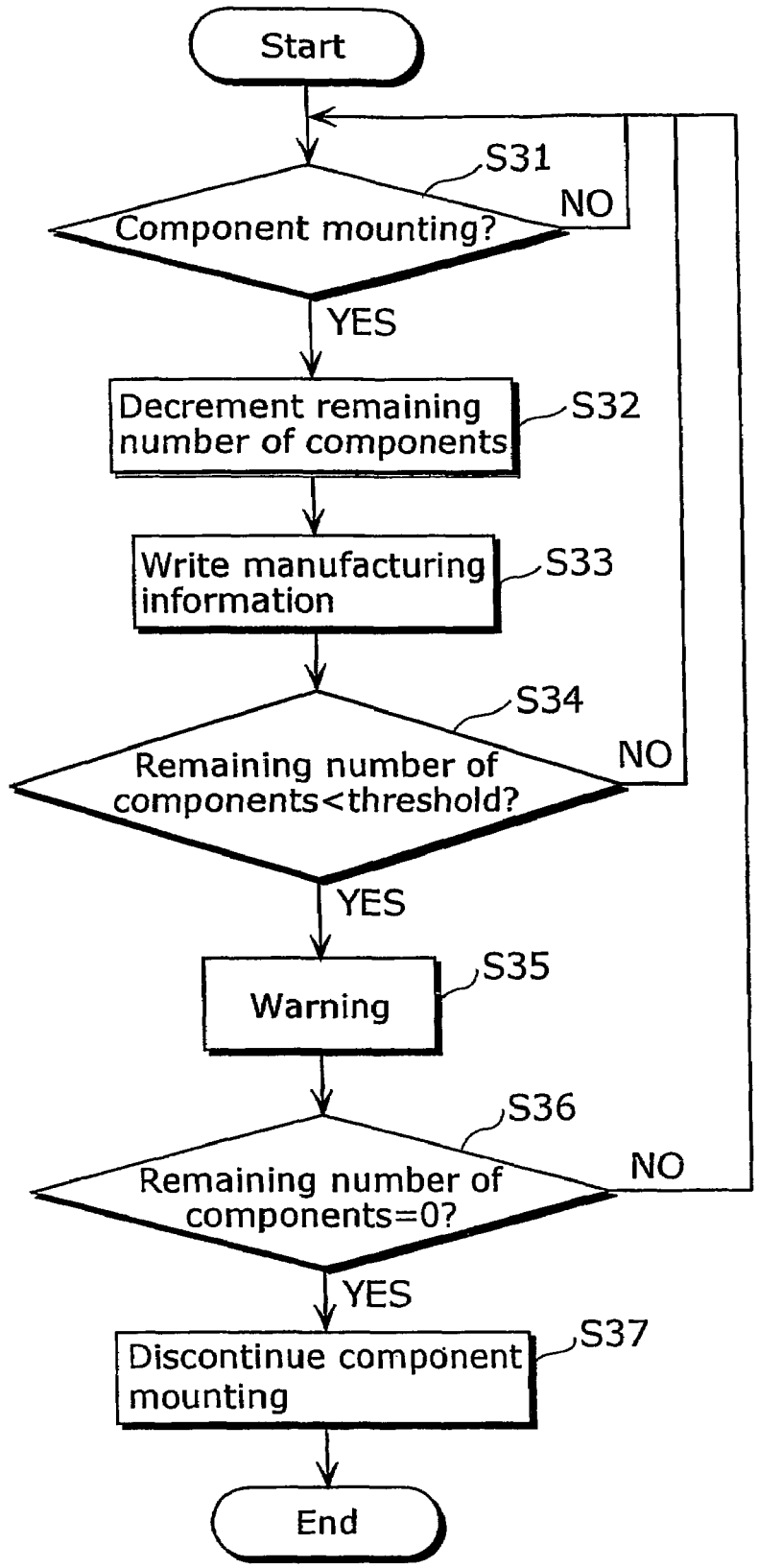
FIG. 22 is a flowchart showing manufacturing information write processing according to the first embodiment of the present invention.

FIG. 22 is a flowchart showing manufacturing information write processing (component management processing).

Manufacturing information write processing is intended for writing manufacturing information to an IC tag that is attached to a board at the time of component mounting. A program for this processing is executed in parallel with the program for component mounting processing. Every time a component is mounted onto a board (YES in S31), the component verification apparatus 300 decrements, by one, the number of remaining components to be mounted (S32). When performing the above decrement, the component verification apparatus 300 regards, as the remaining number of components, the number of components that were registered in each IC tag 426*b* at the time of component tape placement, and performs.

Next, the component verification apparatus 300 writes, to the IC tag attached to the board, information about each component that has been mounted (S33). Aside from component information, the component verification apparatus 300 may also write information related to the mounter 100 (200) that was used for manufacturing. For example, information that may be written to an IC tag includes component information related to a component that was mounted onto a board, as well as manufacturing information such as production management information, error information, nozzle information and camera information. The IC tag reader/writer 111 is used for writing such information.

Subsequently, the component verification apparatus 300 checks if the remaining number of the components is below a predetermined threshold (S34). If the remaining number is below the threshold (YES in S34), the component verification apparatus 300 issues a warning (S35) since it means the remaining number of the components is small. After issuing the warning, the component verification apparatus 300 checks if the remaining number of the components is zero or not (S36), and if the remaining number becomes zero (YES in S36), it makes the mounter 100 (200) discontinue the component mounting (S37).

As above, by writing information related to a manufacturing apparatus and components to an IC tag 426*b* attached to a board, it becomes possible to trace manufacturing-related information.

As described above, according to the present embodiment, component information is obtained in a noncontact manner from the IC tag that is attached to a supply reel so as to perform component verification. Accordingly, it becomes possible to perform component verification with less labor.

What is more, according to the present embodiment, there is no need to move component cassettes for the purpose of reading component information, which makes it possible to reduce operating losses at the time of component mounting.

Moreover, in the present embodiment, when a seam is detected on a carrier tape, component information is obtained from the IC tag of a newly connected component tape so as to perform component verification. This makes it possible to prevent errors of connecting component tapes.

Furthermore, in the present embodiment, information about mounted components is written to an IC tag that is attached to a board. This helps an investigation into the cause of product deficiency.

Second Embodiment

Next, a description is given of a component mounting system according to the second embodiment of the present invention. The configuration of the component mounting system according to the present embodiment is the same as that presented in the first embodiment. However, the component mounting system according to the present embodiment is further capable of performing component arrangement data generation processing and component library generation processing to be described below, prior to component mounting.

<Component Arrangement Data Generation processing>

Figure 23:
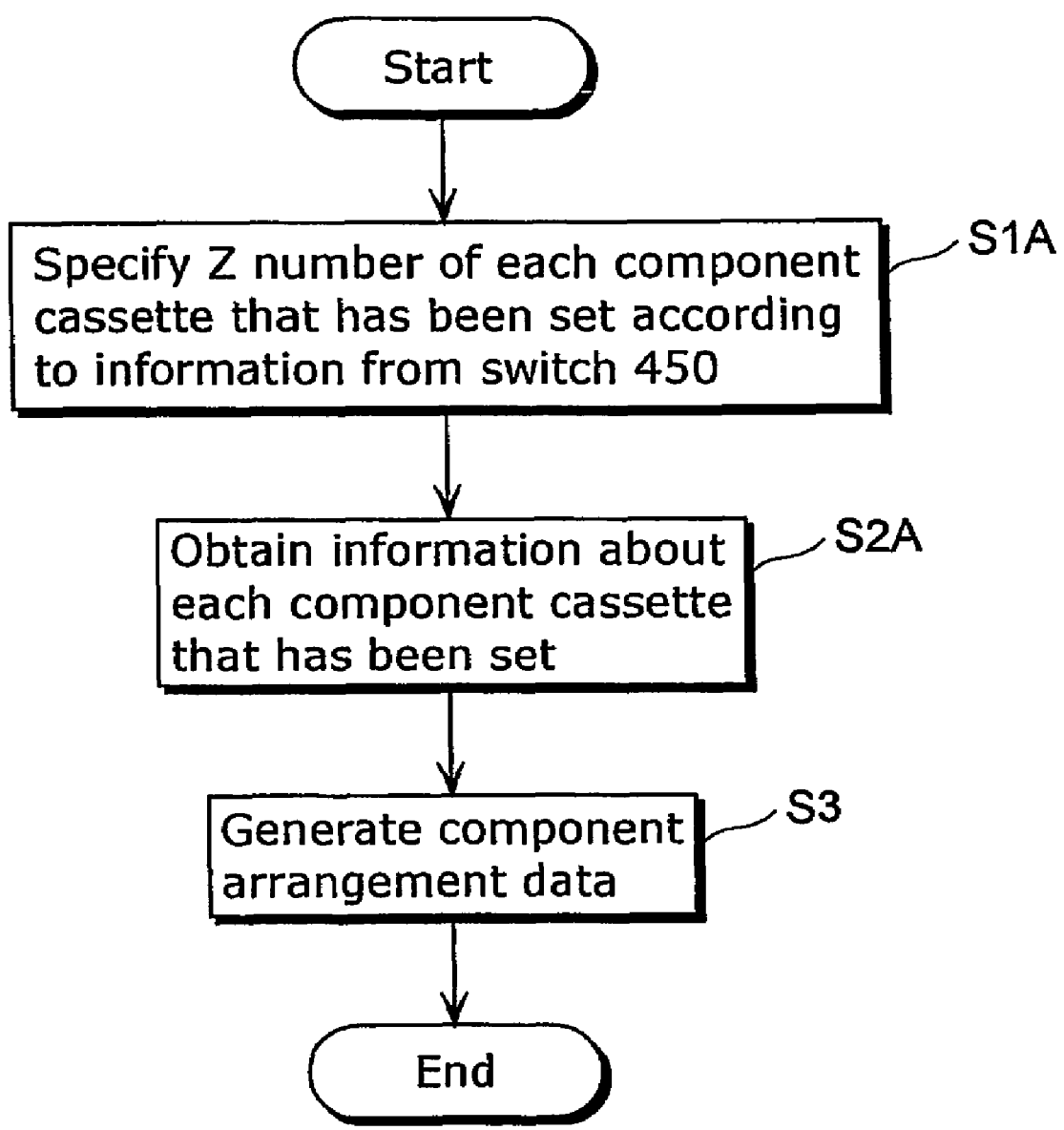
FIG. 23 is a flowchart showing component arrangement data generation processing according to a second embodiment of the present invention.

FIG. 23 is a flowchart showing component arrangement data generation processing.

Prior to component mounting, processing as shown in FIG. 23 is performed for generating component arrangement data. The component verification apparatus 300 checks the Z number of each of the components cassettes 114 that have been set, based on information from the respective switches 450 of the component supplying units 115*a* and 115*b* shown in FIG. 15 (S1A). Next, the component verification apparatus 300 obtains information about each IC tag 426*b* (e.g. component name) received by one IC tag reader/writer 111 (S2A).

The component verification apparatus 300 generates component arrangement data made up of component names, unit IDs and Z numbers, based on the information obtained from each IC tag 426*b*, and stores the generated component arrangement data into the component arrangement data storing unit 308 (S3).

As described above, by simply setting necessary component tapes to the component supplying units 115a and 115b, it becomes possible to know which component has been set at which position, i.e., it becomes possible to automatically generate arrangement data and perform component mounting without requiring the user to generate component arrangement data in advance. Furthermore, the required number of IC tag readers/writers 111 is only one. Particularly in the case where only a small number of components of various types are produced, there is no point of optimizing component arrangement since only a small number of boards are produced for each component type. In such case too, the present embodiment is capable of offering the advantages that, even when a machine operator has set component tapes randomly for the above reason, component arrangement data exactly indicating such random arrangement is quickly generated.

In the component arrangement data generation processing shown in FIG. 23, the Z number of a component cassette 114 is specified based on an output of the switch 450. Therefore, in the case of double cassette, it is impossible to correctly specify the position of each component tape. Moreover, also in the case where plural component cassettes have been simultaneously set in a collective manner, it is impossible to specify the position of each component tape. For this reason, the present embodiment may be configured so that the position of each component tape can be specified by use of the IC tag readers/writers 111 as shown in FIG. 24.

Figure 24:
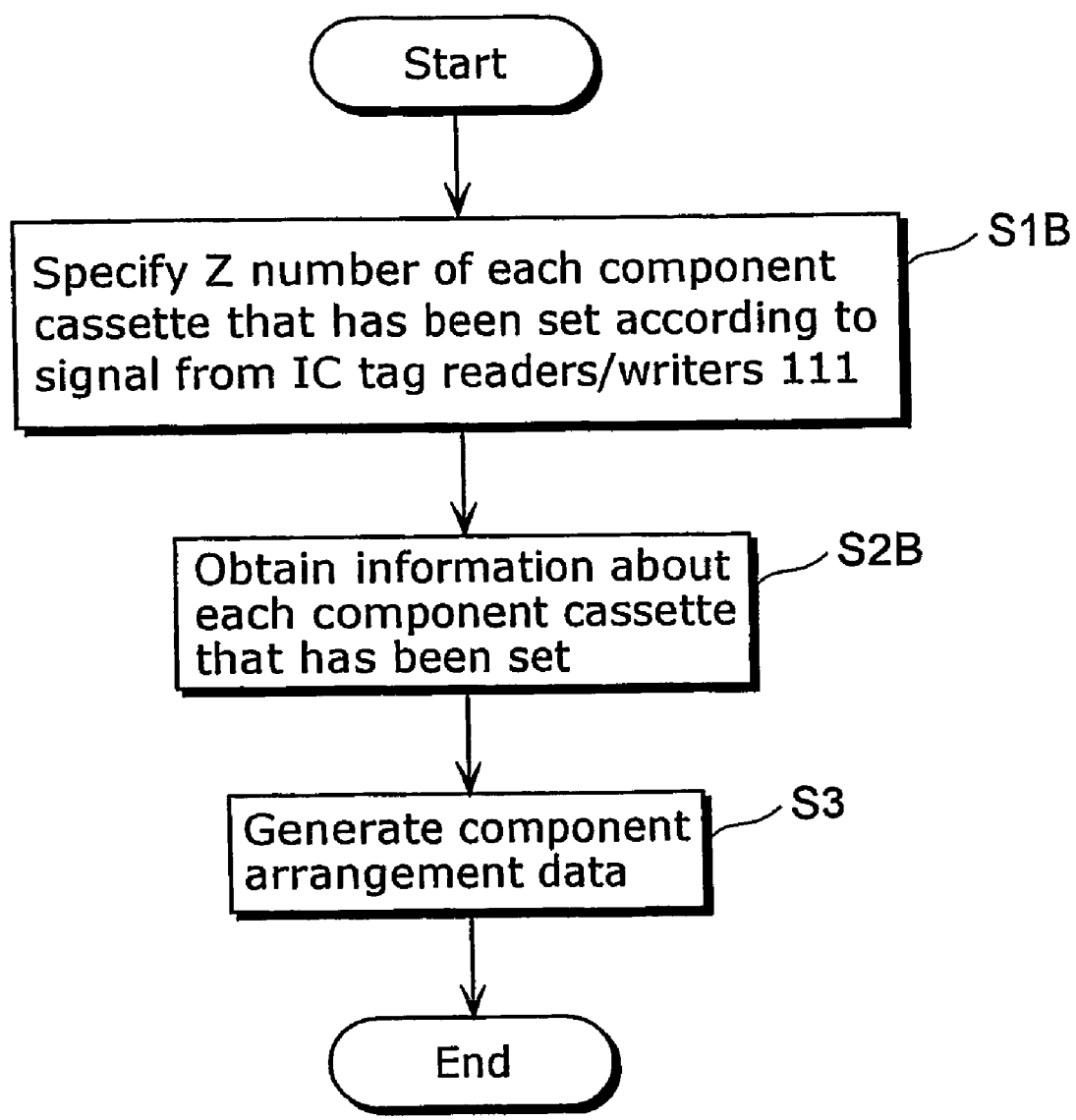
FIG. 24 is a flowchart showing a variation of the component arrangement data generation processing according to the second embodiment of the present invention.

FIG. 24 is a flowchart showing a variation of component arrangement data generation processing shown in FIG. 23.

The component verification apparatus 300 checks the Z number of each of the component cassettes 114 that have been set, based on information from the two IC tag readers/writers 111 (S1B). Next, the component verification apparatus 300 obtains information about each IC tag 426b received from the two IC tag readers/writers 111 (e.g. component name) (S2A). In so doing, the component verification apparatus 300 specifies the Z number included in the obtained information at the same time, based on the direction in which electric waves were transmitted from each IC tag 426b. This makes it possible for the component verification apparatus 300 to know the Z number of a component cassette 114 from which the information has been obtained. The component verification apparatus 300 generates component arrangement data made up of component names, unit IDs and Z numbers, based on the information obtained from each IC tag 426b, and stores the generated component arrangement data into the component arrangement data storing unit 308 (S3). Note that in the case of double cassette, information is also written as an item of component arrangement data about which one of right side and left side each component tapes is stored. As described above, by using the two IC tag readers/writers 111, it is possible to generate component arrangement data that includes information about which one of right side and left side each component tape is stored in the case of double cassette. In this case, a switch 450 is not necessarily required.

<Component Library Generation Processing>

Figure 25:
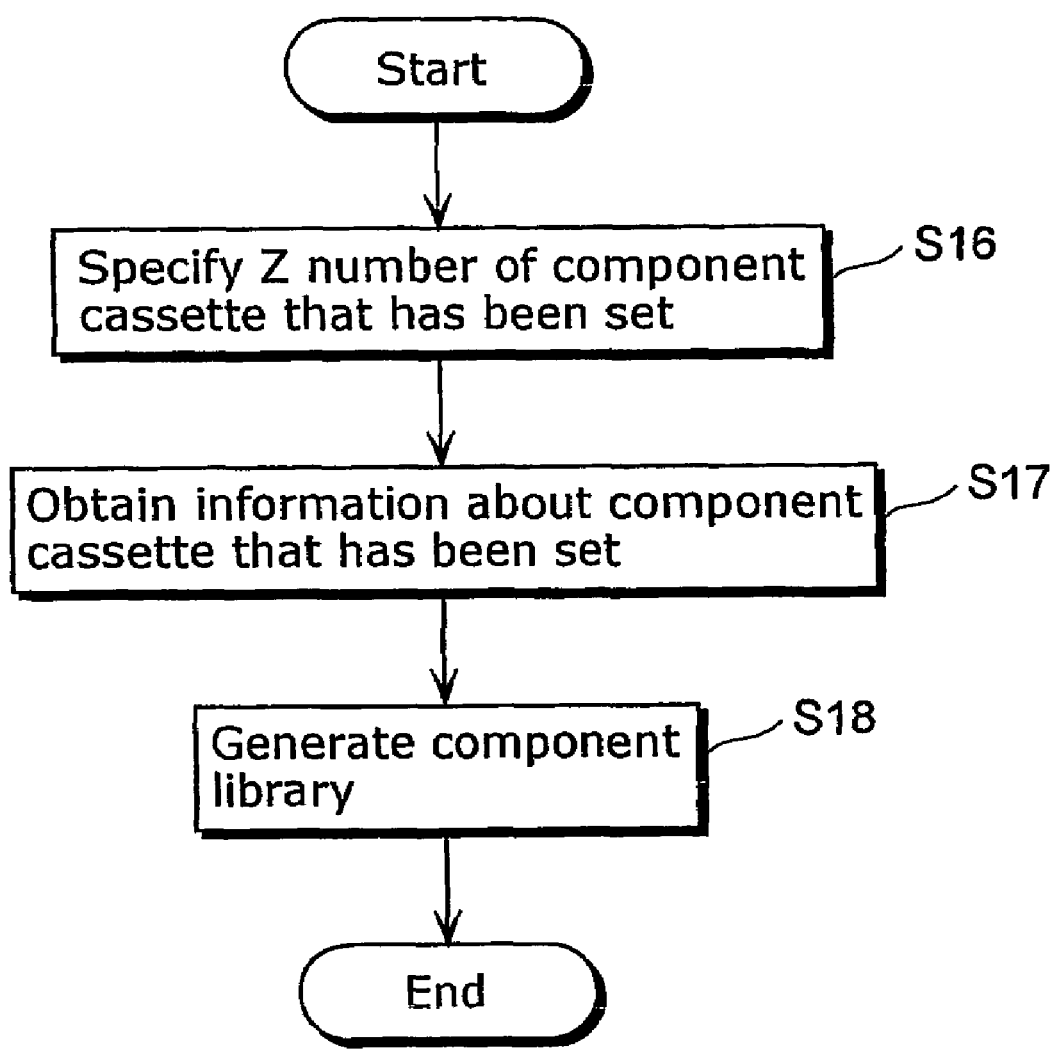
FIG. 25 is a flowchart showing component library generation processing according to the second embodiment of the present invention.

FIG. 25 is a flowchart showing component library generation processing.

Prior to component mounting, component library generation processing as shown in FIG. 25 is performed. The component verification apparatus 300 checks the Z number of each of the component cassettes 114 that have been set, based on information from the respective switches 450 of the component supplying units 115a and 115b shown in FIG. 15 (S16). Next, the component verification apparatus 300 obtains information about each IC tag 426b received from the two IC tag readers/writers 111 (e.g. component name) (S17). In so doing, the component verification apparatus 300 specifies the Z number included in the obtained information at the same time, based on the direction in which electric waves were transmitted from each IC tag 426b. This makes it possible for the component verification apparatus 300 to know the Z number of a component cassette 114 from which the information has been obtained.

The component verification apparatus 300 generates a component library as shown in FIG. 12, using the component information obtained from each IC tag 426b (S18).

As described above, it is possible to reduce the user's labor of generating a component library since it is generated automatically.

As explained above, in addition to the operations as well as effects of the first embodiment, the present embodiment is also capable of specifying the Z number included in information that has been obtained on the basis of the strength of electric waves received from an IC tag. Accordingly, there is no need to move component cassettes for the purpose of specifying Z numbers. This makes it possible to generate component arrangement data at high speed.

What is more, component library information stored in an IC tag is read out and a component library is generated automatically. Accordingly, it becomes possible to generate a component library without using much labor.

Third Embodiment

In the component mounting system 10 according to the first embodiment, the manufacturing information write processing (component management processing) is performed using data that is read from the IC tag attached to a reel, but in the component mounting system according to the third embodiment, manufacturing information write processing is performed using data that is read from the IC tag attached at the front of a component tape.

The following describes the component mounting system according to the present embodiment with reference to drawings.

Figure 26:
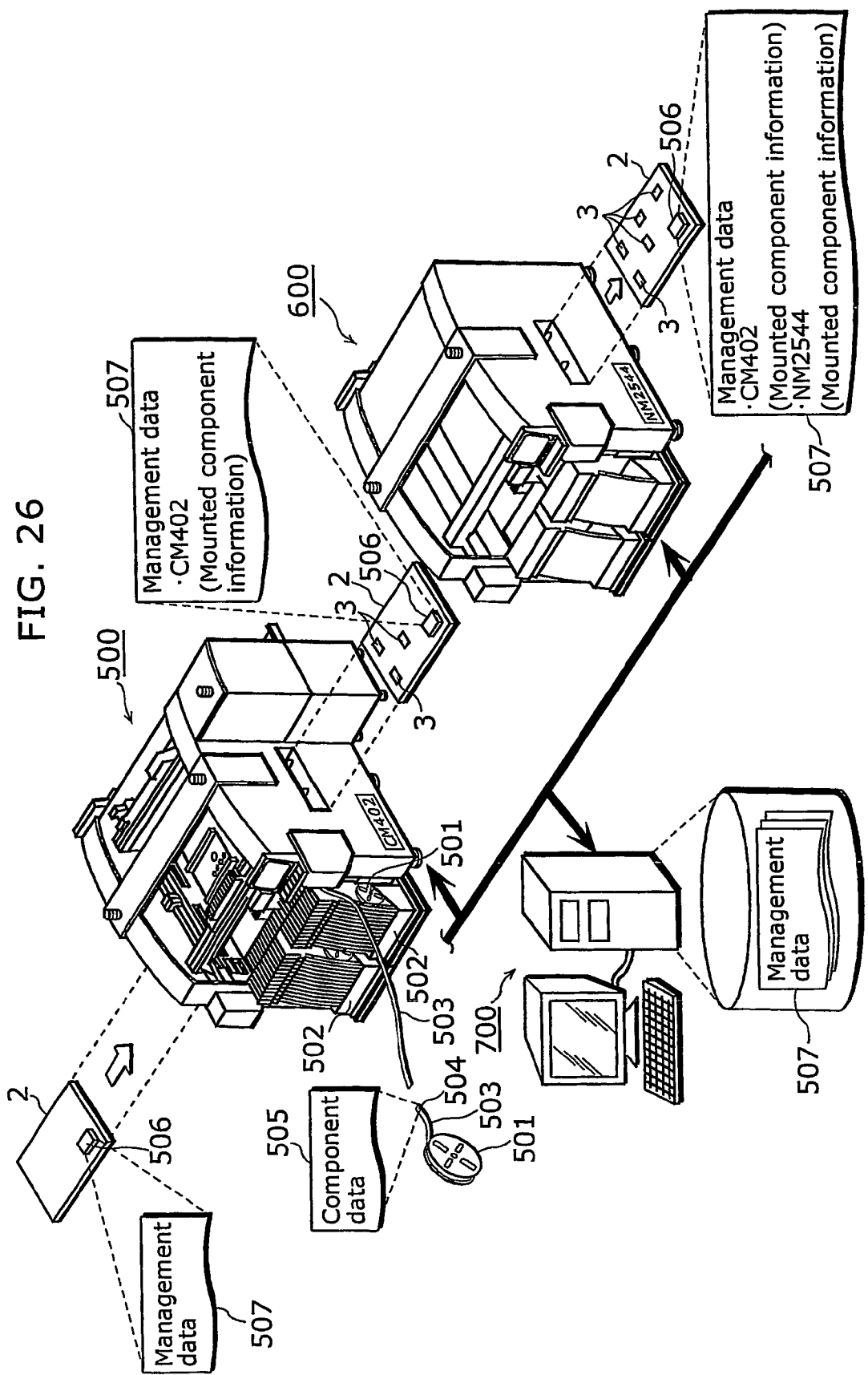
FIG. 26 is a construction diagram showing the construction of a component mounting system according to a third embodiment of the present invention.

FIG. 26 is a construction diagram showing the construction of the component mounting system according to the present embodiment.

This component mounting system is comprised of mounters 500 and 600 that mount electronic components 3 onto a printed board 2, as well as a control apparatus 700 that controls these mounters 500 and 600, thereby managing each of the electronic components 3 mounted on the printed board 2 in a reliable manner.

The mounters 500 and 600 are each equipped with a component supplying unit 502 in which a plurality of reels 501 are set. The mounter 500/600 pulls a component tape 503 off a reel 501 in the component supplying unit 502, takes out electronic components 3 held by such component tape 503, and mounts the electronic components 3 onto the printed board 2 that has been inserted.

Here, each component tape 503 is attached with an IC tag 504 for tape (hereinafter referred to as "tape IC tag 504"). Component data 505 indicating the details of electronic components 3 held by each component tape 503 is stored in each tape IC tag 504.

A printed board 2 is attached with an IC tag 506 for board (hereinafter referred to as "board IC tag 506") having an area where management data 507 is stored indicating electronic components 3 mounted on such board 2 as well as a result of component mounting.

Tape IC tag 504 and board IC tag 506 as described above are intended for carrying out communications in a noncontact manner by use of a method known as Radio Frequency Identification (RFID) so as to store information and transmit stored information through such communications.

In other words, each of the mounters 500 and 600 according to the present embodiment reads out, from the tape IC tag 504, the component data 505 of the electronic components 3 held by the component tape 503, and when the mounting operation completes, writes, as the management data 507, the details about the mounted electronic components 3 and the details about a result of the component mounting, to the board IC tag 506 of the printed board 2 on which such electronic components 3 have been mounted. Furthermore, the mounters 500 and 600 according to the present embodiment mount electronic components 3 differently depending on the contents of the component data 505 read off the tape IC tag 504.

Meanwhile, the control apparatus 700 obtains, from the mounters 500 and 600, the management data 507 written to the board IC tag 506 by each of such mounters 500 and 600, and stores the obtained management data 507 in a collective manner.

Figure 27:
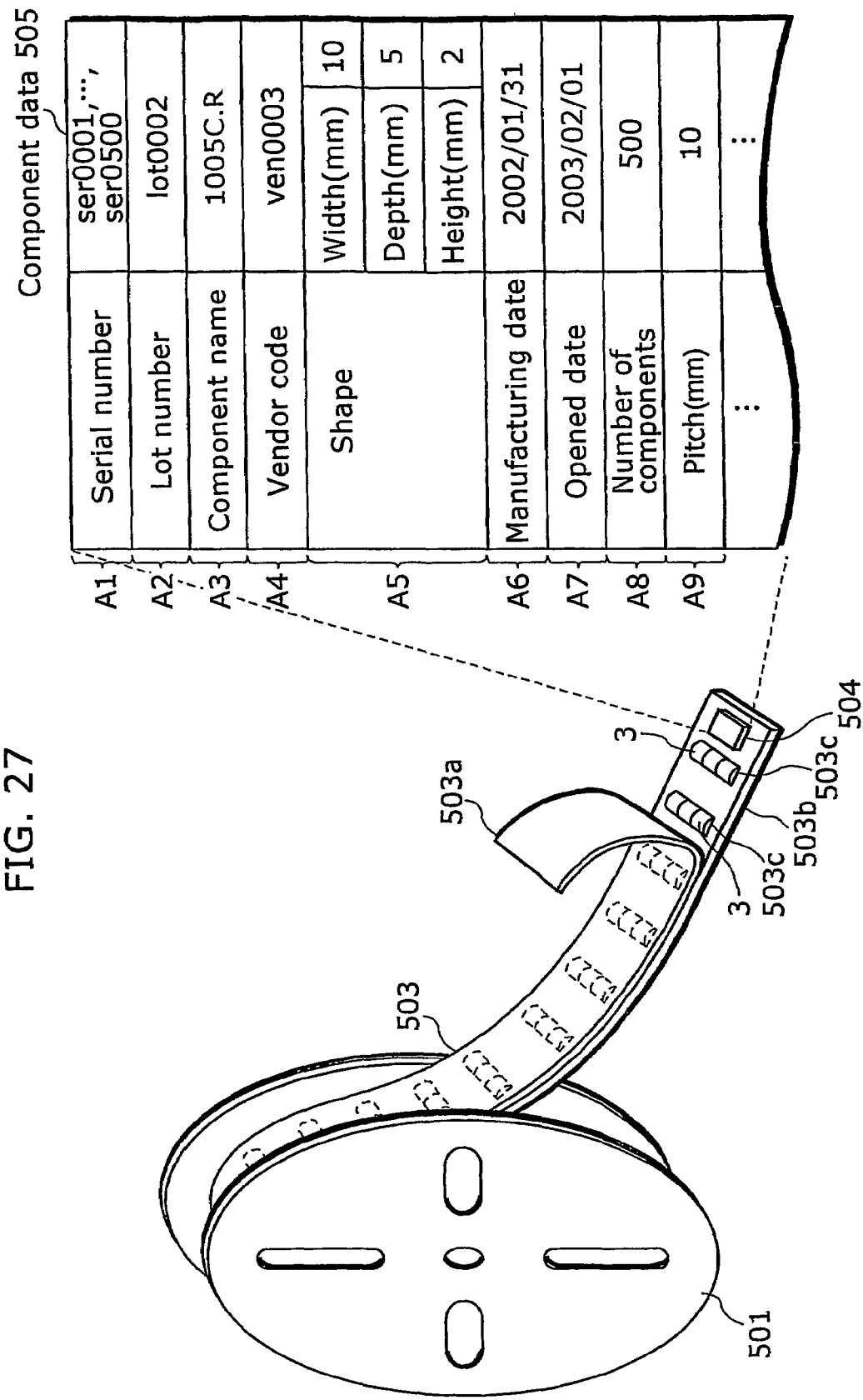
FIG. 27 is a diagram for explaining a component tape according to the third embodiment of the present invention.

FIG. 27 is a diagram for explaining a component tape 503 according to the present embodiment.

A component tape 503 according to the present embodiment is wound around a reel 501, and is made up of a carrier tape 503b on which electronic components 3 are placed, a cover tape 503a that is applied over the carrier tape 503b, and a tape IC tag 504 as described above.

The carrier tape 503b is made of a thin resin molding, paper, or the like. A plurality of electronic components 3 are stored in concave-shaped storage areas 503c that are formed on the carrier tape 503b approximately equally spaced from each other.

The cover tape 503a, which is made of translucent synthetic resin, for example, is applied over the carrier tape 503b so that the electronic components 3 will not be dislodged from the storage areas 503c on the carrier tape 503b, i.e., so that each of the storage areas 503c can be covered.

The tape IC tag 504 which is attached at the front edge of the carrier tape 503b, and the component data 505 stored therein includes information indicating the lot as well as the manufacturer of the electronic components 3.

The above tape IC tag 504 is attached to the carrier tape 503b beforehand. After the electronic components 3 are placed and stored onto the carrier tape 503b, the component data 505 corresponding to such electronic components 3 is written to the tape IC tag 504.

As shown in FIG. 27, for example, the component data 505 includes: serial number field A1 in which the serial numbers of the respective electronic components 3 held by the component tape 503 are stored; lot number field A2 in which the lot number of the electronic components 3 held by the component tape 503 is stored; component name field A3 in which the name of the electronic components 3 is stored; vendor field A4 in which the vendor code of the manufacturer of the electronic components 3 is stored; shape field A5 in which the details of the shape of the electronic components 3 are stored; manufacturing date field A6 in which the date on which the electronic components 3 were manufactured is stored; opened date field A7 in which the date on which the sealed electronic components 3 were opened after being manufactured; the number of components field A8 in which the number of the electronic components 3 held by the component tape 503 is stored; and pitch field A9 in which a pitch between the stored electronic components 3 is stored.

More specifically, stored in the serial number field A1 is "ser0001, . . . , ser0500" that are the serial numbers of the respective electronic components 3, stored in the lot number field A2 is "lot0002" that is the lot number of the electronic components 3, stored in the component name field A3 is "1005C. R" that is the component name of the electronic components 3, and stored in the vender field A4 is "ven0003" that is the vendor code indicating the manufacturer of the electronic components 3. Note that the serial numbers of the respective electronic components 3 are stored, for example, in the order in which these electronic components 3 have been placed on the component tape 503.

Furthermore, stored in the shape field A5 are the width "10 mm", depth "5 mm", and height "2 mm" of the electronic components 3.

Stored in the manufacturing date field A6 is "Jan. 31, 2002" that is the manufacturing date of the electronic components 3, stored in the opened date field A7 is "Feb. 1, 2003" that is the date on which the electronic components 3 were opened, stored in the number of components field A8 is "500" that is the number of the electronic components 3 held by the component tape 503, and stored in the pitch field A9 is "10 mm" that is the pitch of the electronic components 3.

In order to replace component tapes 503 as described above, the leading edge of a new component tape 503 is connected to the trailing edge of a component tapes 503 pulled out from the mounter 500/600.

Figure 28A:
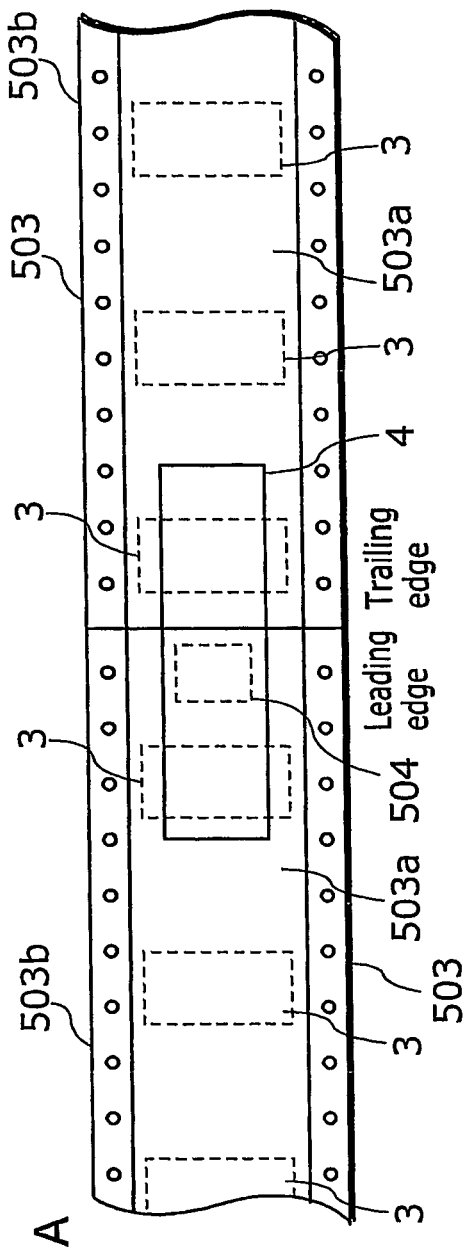
FIG. 28A is a diagram showing an example of how the leading edge of a new component tape is connected to the trailing edge of the current component tape according to the third embodiment of the present invention.
Figure 28B:
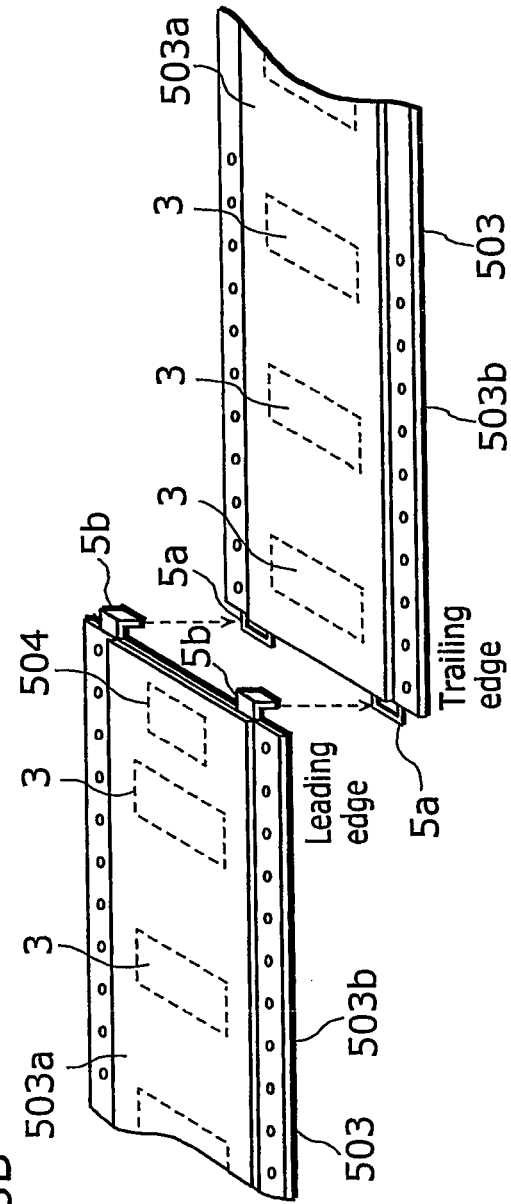
FIG. 28B is a diagram showing another example of how the leading edge of a new component tape is connected to the trailing edge of the current component tape according to the third embodiment of the present invention.

FIGS. 28A and 28B are diagrams illustrating the leading edge of a new component tape 503 being connected to the trailing edge of a component tape 503.

As FIG. 28A shows, a connection tape 4 for connecting two tapes is applied over the trailing edge of the component tape 503 and the leading edge of the new component tape 503. In other words, when connecting two component tapes 503, a worker puts the trailing edge of the component tape 503 pulled out from the mounter 500/600 close to the leading edge of the new component tape 503, and places the connection tape 4 over their connection part.

Alternatively, as FIG. 28B shows, the two tapes 503 may be connected with each other by hooking, onto two hooks 5b attached to the new component tape 503, "Π"-shaped two locking parts 5a that are attached to the trailing edge of the component tape 503.

In the case where two component tapes 503 are connected as described above, a tape IC tag 504 is located at such connected part.

Stated another way, the mounters 500 and 600 according to the present embodiment always monitor a pulled-out part of a component tape 503 while mounting operation is taking place, and when detecting a tape IC tag 504, they confirm that a new component tape 503 is connected from the point where such detected tape IC tag 504 is attached, i.e., component tapes 503 are replaced.

Figure 29:
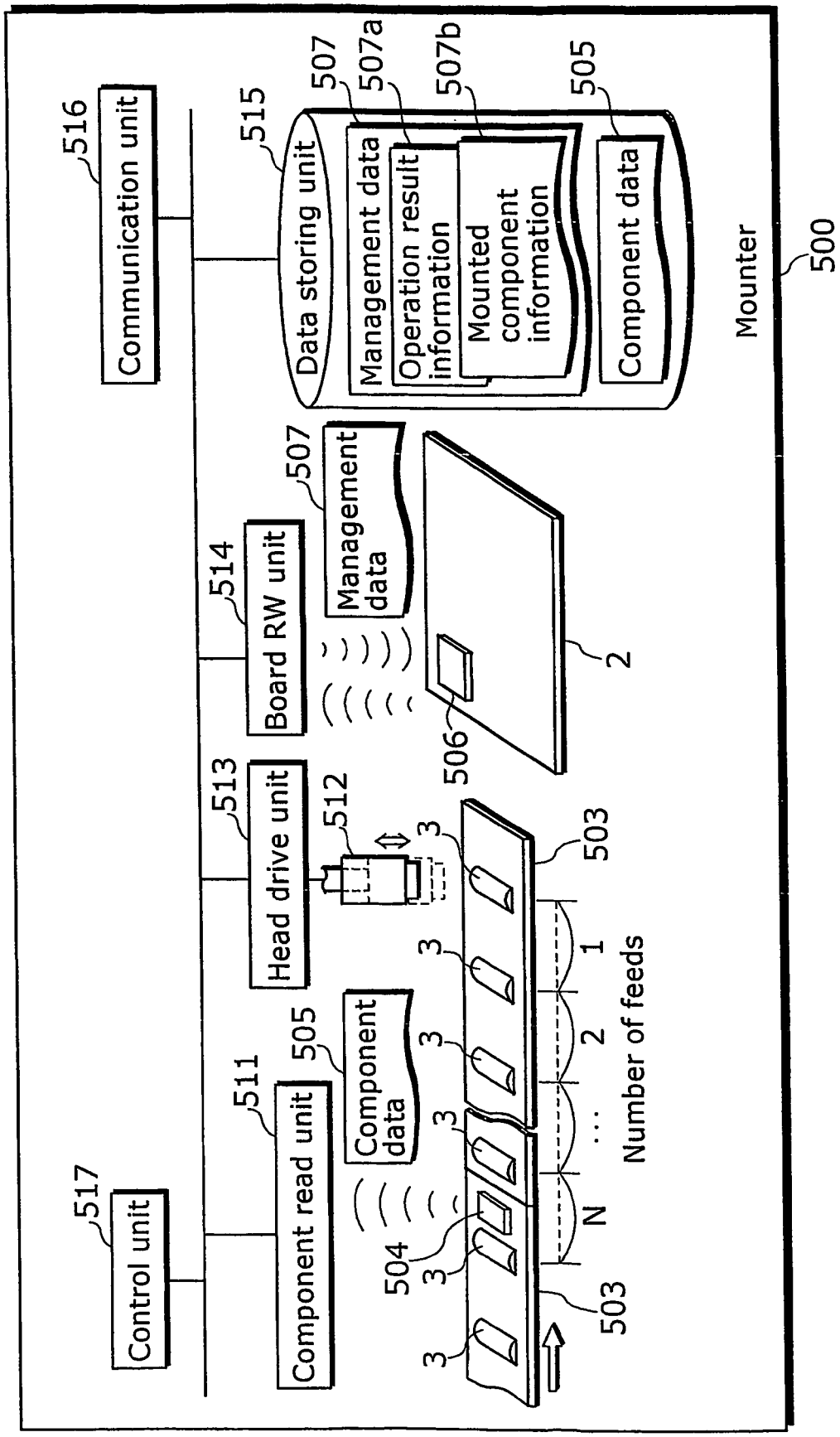
FIG. 29 is a block diagram showing an internal construction of a mounter according to the third embodiment of the present invention.

FIG. 29 is a block diagram showing an internal construction of the mounter 500 according to the present embodiment. Note that the mounter 600 has the same construction as that of the mounter 500.

The mounter 500 is comprised of a component read unit 511, a head 512, a head drive unit 513, a board RW unit 514, a data storing unit 515, a communication unit 516, and a control unit 517 that controls each of these constituent elements.

The component read unit 511 detects the tape IC tag 504 attached to a component tape 503 so as to communicate with such tape IC tag 504 in a noncontact manner, and reads the component data 505 stored in the tape IC tag 504.

The head 512 picks up electronic components 3 held by the component tape 503, and mounts them onto a printed board 2.

The head drive unit 513 drives the head 512 under the control of the control unit 517.

The board RW unit 514 communicates with the board IC tag 506 attached to the printed board 2 in a noncontact manner, and reads in management data 507 stored in such board IC tag 506 as well as writing newly updated management data 507 to the board IC tag 506.

The data storing unit 515 stores management data 507 and component data 505 under the control of the control unit 517.

The communication unit 516 sends, to the control apparatus 700, the management data 507 and the component data 505 stored in the data storing unit 515 under the control of the control unit 517.

Here, the management data 507 is made up of: operation result information 507a indicating a detailed result of a mounting operation performed for the printed board 2 by each machine (e.g. mounter); and mounted component information 107b indicating details of electronic components mounted by each machine.

FIG. 30 is a diagram showing the details of the operation result information 507a.

This operation result information 507a includes a board ID (e.g. "PB01ID") that is assigned to a printed board 2 for identification purposes, and the lot number of such printed board 2 (e.g. "PB01Rt").

Furthermore, the operation result information 507a also includes: machine name field B1 in which the name of each machine that has performed an operation for the printed board 2 is stored; insertion date/time field B2 in which the date on which the printed board 2 was inserted to each machine is stored; tact time field B3 in which time (tact time) required by each machine to complete the operation is stored; PG field B4 in which the name of a program that was executed by each machine for the printed board 2 is stored; error field B5 in which details of an error is stored in the case where an error occurred at the time of program execution; and index field B6 in which an index indicating mounted component information 507b related to the operation of each machine is stored. Here, the operation result information 507a is associated with mounted component information 507b on a machine-by-machine basis, by including an index to the operation result information 507a.

More specifically, the following information is stored in the respective fields: the machine name field B1—"CM402" that is the machine name of the mounter; the insertion date/time field B2—"2003/01/06 11:16:34" that is the date and time on which the printed board 2 was inserted to the mounter 500; the tact time field B3—"35 seconds" that is the time required by the mounter 500 to complete the mounting operation; the PG field B4—"PTESTA" that is the name of a program that was executed by the mounter 500 for the printed board 2; and the index field B6—"Idx01" that is the index of the mounted component information 507b related to the electronic components 3 mounted by the mounter 500. Furthermore, the following is further included in the error field B5, for example: "2003/01/06 11:16:55" that is the occurrence date and time on which an error occurred at program execution time; "MC0005" that is the error code of such error; and "100" that is the step at which such error occurred.

FIG. 31 is a diagram showing details of mounted component information 507b.

The above-described indexes are assigned to the respective mounted component information 507b, and each piece of mounted component information 507b is identified by its index.

For example, the mounted component information 507b with the index "Idx01" includes the component name of each electronic component 3 mounted by the mounter 500 as well as its serial number.

More specifically, such mounted component information 507b includes: position field C1 in which the position of each component on the printed board 2 is stored; component name field C2 in which the component name of an electronic component 3 mounted in each position is stored; serial number field C3 in which the serial number of each electronic component 3 is stored; lot number field C4 in which the lot number of each electronic component 3 is stored; and Z-axis field C5 in which the position (position on the Z-axis) at which the reel 501 of each electronic component 3 was placed is stored.

For example, the following information is stored in the respective fields: position field C1—"X1, Y1" that is the position of a mounted electronic component 3 on the printed board 2; component name field C2—"1005C. R" that is the component name of such electronic component 3; serial number field C3—"ser0001" that is the serial number of such electronic component 3; lot number field C4—"lot0002" that is the lot number of such electronic component 3; and Z-axis field C5—"10" that is the position on the Z-axis on which the reel 501 of such electronic component 3 was placed. Note that the "Z-axis" refers to the direction in which a plurality of reels 501 are arranged on the component supplying unit 502 of the mounter 500.

When a printed board 2 is inserted, the control unit 517 of the mounter 500 according to the present embodiment controls the board RW unit 514 to read the management data 507 from the board IC tag 506 attached to such printed board 2, and causes the data storing unit 515 to temporarily store the read-out management data 507. Then, upon completion of the mounting operation on the printed board 2, the control unit 517 updates the management data 507 stored in the data storing unit 515 by adding the result of such mounting operation, and controls the board RW unit 514 again to write such updated management data 507 to the board IC tag 506.

Moreover, the control unit 517 of the mounter 500 according to the present embodiment judges whether a tape IC tag 504 is attached to a pulled-out component tape 503, based on a result of a communication performed by the component read unit 511. When judging that a tape IC tag 504 is attached, the control unit 517 recognizes that a new component tape 503 has been connected to the current component tape 503 from the position where such tape IC tag 504 is attached. Subsequently, the control unit 517 controls the component read unit 511 to read the component data 505 stored in such tape IC tag 504, and causes the data storing unit 515 to stored such read-out component data 505.

Meanwhile, when updating the management data 507, the control unit 517 reads the component data 505 corresponding to the mounted electronic components 3 from the data storing unit 515, and stores its details in fields such as the component name field C2 and serial number field C3 in the mounted component information 507b included in the management data 507. To be more specific, since a plurality of reels 501 are placed on the mounter 500, each component data 505 that is read from the tape IC tag 504 attached to the component tape 503 of each of these reels 501 is stored in the data storing unit 515 in association with the Z-axis position of the corresponding reel 501. Since the control unit 517 of the mounter 500 memorizes the Z-axis position of the reel 501 from which each electronic component 3 is taken when electronic components 3 are mounted, it reads from the data storing unit 515 the component data 505 that is associated with such memorized Z-axis position, when updating the mounted component information 507b included in the management data 507. The control unit 517 writes items included in such read-out component data 505 such as component name and serial number to their corresponding fields in the mounted component information 507b.

Accordingly, as shown in FIG. 31, the serial number, lot number, mounting point (on the printed board 2), and the like of each of the electronic components mounted on the printed board 2 are indicated on a machine-by-machine basis in the board IC tag 506.

Here, when judging that a tape IC tag 504 is attached to a component tape 503, the control unit 517 recognizes that electronic components 3 to be picked up by the head 512 switch to ones held by a new component tape 503 after the current component tape 503 is fed "N" times, based on a distance between the head 512 and the position at which the tape IC tag 504 was detected (position from which the component data 505 has been read). Then, based on the component data 505 read out by the component read unit 511, the control unit 517 judges whether or not the shapes of the electronic components 503 are different before and after the component tape 503 is replaced by the new one. When judging that the shapes of the electronic components are different, the control unit 517 controls the head drive unit 513 so that the head 512 picks up electronic components 3 held by the new component tape 503 differently, after the above N times of feeding, in accordance with the shape of such electronic components 3.

For instance, when judging that the height of the electronic components 3 becomes lower, the control unit 517 controls the head drive unit 513 so that the pickup part of the head 512 becomes lower in accordance with such height. This makes it possible to mount electronic components 3 in a safe and reliable manner without causing any breakage.

Furthermore, when judging that the function and the like of the electronic components 3 is different, the control unit 517 controls the head drive unit 513 so that the pickup operation of the head 512 will be terminated. This makes it possible to prevent wrong electronic components 3 from being mounted.

Figure 32:
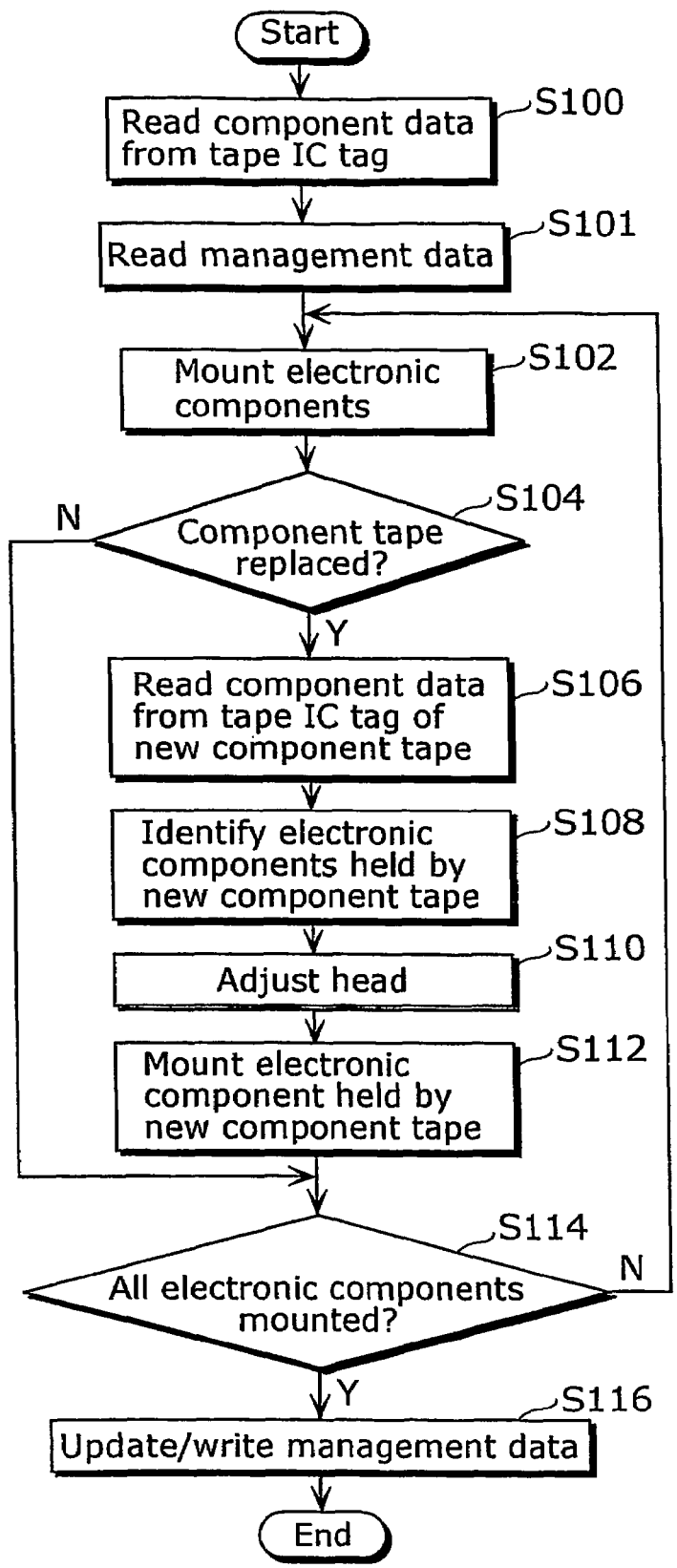
FIG. 32 is a flowchart showing an operation of the mounter according to the third embodiment of the present invention.

FIG. 32 is a flowchart showing an operation of the mounter 500 according to the present embodiment.

First, the mounter 500 reads component data 505 from the tape IC tag 504 attached to a component tape 503 (Step S100) as well as the management data 507 from the board IC tag 506 attached to a printed board 2 inserted (Step S101), and stores such component data 505 and management data 507.

Then, while pulling the component tape 503 off a reel 501, the mounter 500 starts mounting the electronic components 3 held by such component tape 503 onto the printed board 2 (Step S102).

Here, the mounter 500 monitors a pulled-out part of the component tape 503, and judges whether the component tape 503 has been replaced by a new one or not, according a communication with a tape IC tag 504 that is different from the tape IC tag 504 from which the component data 505 has been read out in Step S100 (Step S104).

When judging that the component tape 503 has been replaced by a new one (Y in Step 104), the mounter 500 reads and stores the component data 505 from the tape IC tag 504 of the new component tape 503 (Step S106), and identifies details (e.g. shape) about the electronic components 3 held by the new component tape 503 (Step S108).

Then, the mounter 500 feeds the component tape 503 for a predetermined number of times, and when an electronic components 3 on the new component tape 503 reaches the pickup position of the head 512, it adjusts the height and the like of the head 512 depending on the shape and the like of such electronic component 3 (Step S110). After adjusting the head 512, the mounter 500 picks up such electronic component 3 by the head 512, and mounts it onto the printed board 2 (Step S112).

Furthermore, after mounting the electronic component 3 in Step S112, or when judging that the component tape 503 has not been replaced by a new one in Step S104 (N in Step S104), the mounter 500 judges whether all electronic components have been mounted onto the printed board 2 or not (Step S114).

When judging that not all electronic components 3 have been mounted (N in Step S114), the mounter 500 executes again Step S102 and the subsequent steps, whereas when judging that all electronic components have been mounted (Y in Step S104), it updates the stored management data 507, and writes such updated management data 507 to the board IC tag 506 attached on the printed board 2 (Step S116).

As described above, since a tape IC tag 504 is attached to the front edge of a component tape 503 according to the present embodiment, it becomes possible for the mounter 500 to easily detect a part where component tapes 503 are connected. Furthermore, since such tape IC tag 504 stores component data 505, it becomes possible for the mounter 500 to easily read such component data 505 at the timing that the component tape 503 is replaced by a new one. This saves a worker's labor of reading by a barcode reader a barcode attached to a reel when component tapes are connected, as is required conventionally. As a result, working efficiency will be improved.

What is more, by being equipped with the component read unit 511 that communicates with a tape IC tag 504, it becomes possible for the mounters 500 and 600 according to the present embodiment to detect a connected part of two component tapes 503 and to easily know the details of the electronic components 3 held by the new component tape 503 from the component data 505 stored on the tape IC tag 504 of such new component tape 503. Furthermore, since there is equipped with the board RW unit 514 that communicates with the board IC tag 506 attached on the printed board 2, the mounters 500 and 600 according to the present embodiment write the details about the electronic components 3 mounted on the printed board 2 to the board IC tag 506 that is attached to the printed board 2, based on the details obtained from the component data 505. Accordingly, even if the lots of the electronic components 3 that are respectively held by two-connected component tapes 503 are different, for example, since the board IC tag 506 stores the details about all the electronic components 3 mounted on the printed board 2 as management data 507, it is possible for the mounters 500 and 600 according to the present embodiment to identify the lot of each electronic component 3 mounted on the printed board 2 based on such management data 507. As a result, it becomes possible to manage each of the electronic components 3 mounted on the printed board 2 in a reliable manner.

Moreover, since a printed board 2 according to the present embodiment is attached with a board IC tag 506, it becomes possible to write, to such board IC tag 506, a result of mounting operation as well as the details about mounted electronic components 3 whenever necessary and to manage such information on a printed board 2 basis. In other words, in the case where the details of mounted electronic components 3 are managed by attaching a barcode onto a printed board 2 and where electronic components 3 are additionally mounted onto the same printed board 2, it is necessary to replace the barcode by a new one since barcodes cannot be rewritten. However, by being equipped with a board IC tag 506, the present embodiment is capable of facilitating the management of electronic components 3 without requiring a worker to perform the above troublesome replacement operation.

What is more, in the component mounting system according to the present embodiment, since the control apparatus 700 communicates with each of the mounters 500 and 600 and holds management data 507 in a collective manner, it becomes possible for workers to mange in a collective manner the details about electronic components 3 mounted onto each printed board 2 as well as the details about operation results, without needing to read management data 507 from the board IC tag 506 of each printed board 2.

(Variation 1)

Next, a description is given of a variation of a printed board according to the third embodiment.

Figure 33:
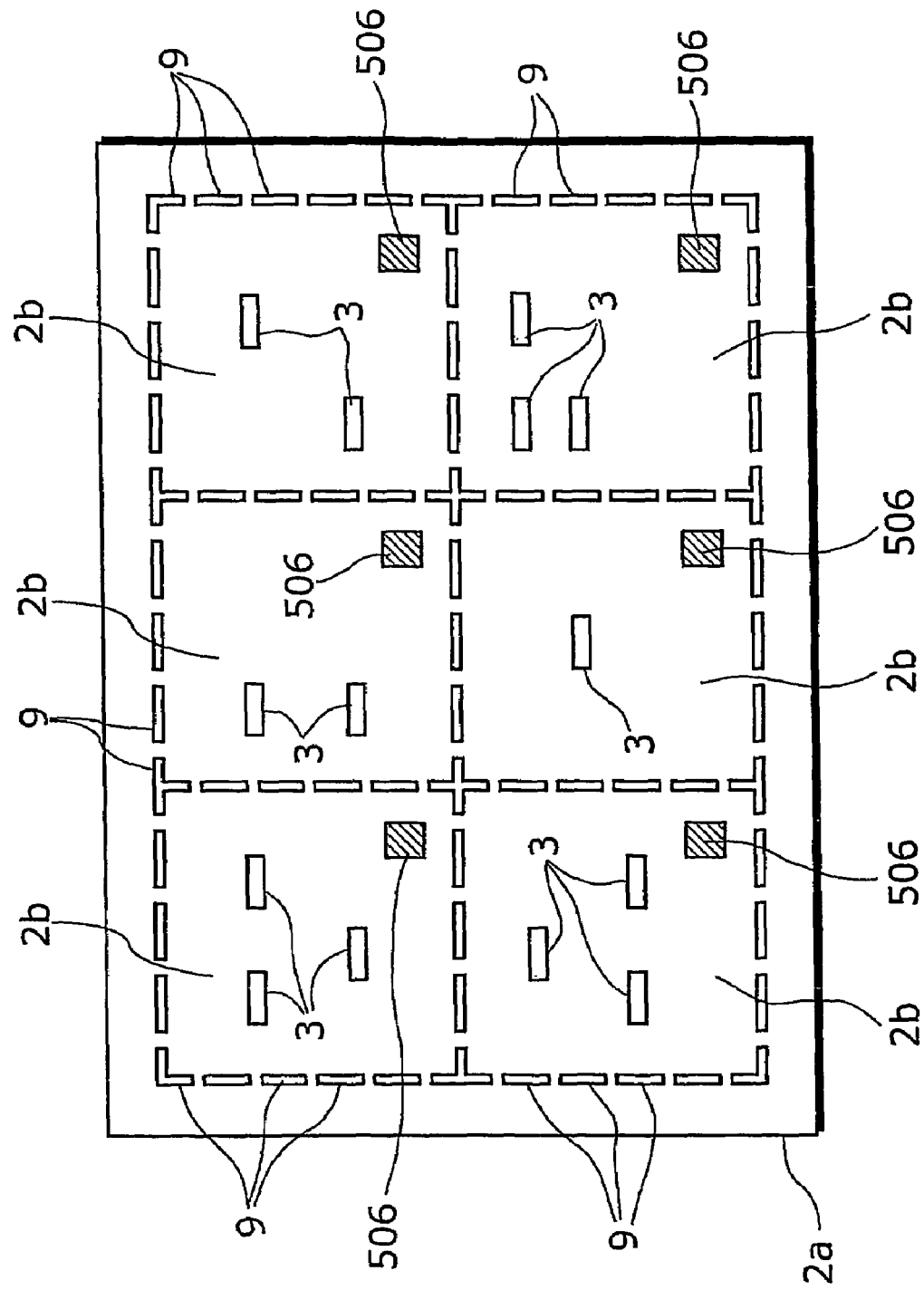
FIG. 33 is a front view of a printed board according to a variation of the third embodiment of the present invention.

FIG. 33 is a front view of a printed board according to the present variation.

As FIG. 33 shows, a printed board 2*a* according to the present variation is a multiple board from which plural sub-boards 2*b* are generated by division. Each sub-board 2*b* is attached with one board IC tag 506.

More specifically, a plurality of trenches 9 that run from the surface through the undersurface of the printed board 2*a* are formed on the printed board 2*a*, and the above-described plural sub-boards 2*b* are formed by being enclosed by plural trenches 9. A board IC tag 506 is attached at a corner of each of these sub-boards 2*b*.

In general, multiple printed boards are inserted into a mounter one by one for mounting of electronic components, but after the mounting operation is finished, each of such multiple printed boards is divided into sub-boards to be put on the market. Thus, if a printed board attached with only one board IC tag 506 as presented in the above embodiments is divided, it becomes impossible to manage electronic components for each divided sub-board.

However, by being attached with a board IC tag 506 for each sub-board 2*b*, the multiple printed board 2*a* according to the present variation enables mounted electronic components 3 to be managed on a sub-board 2*b* basis.

(Variation 2)

Next, a description is given of a variation of a component tape according to the third embodiment.

Figure 34:
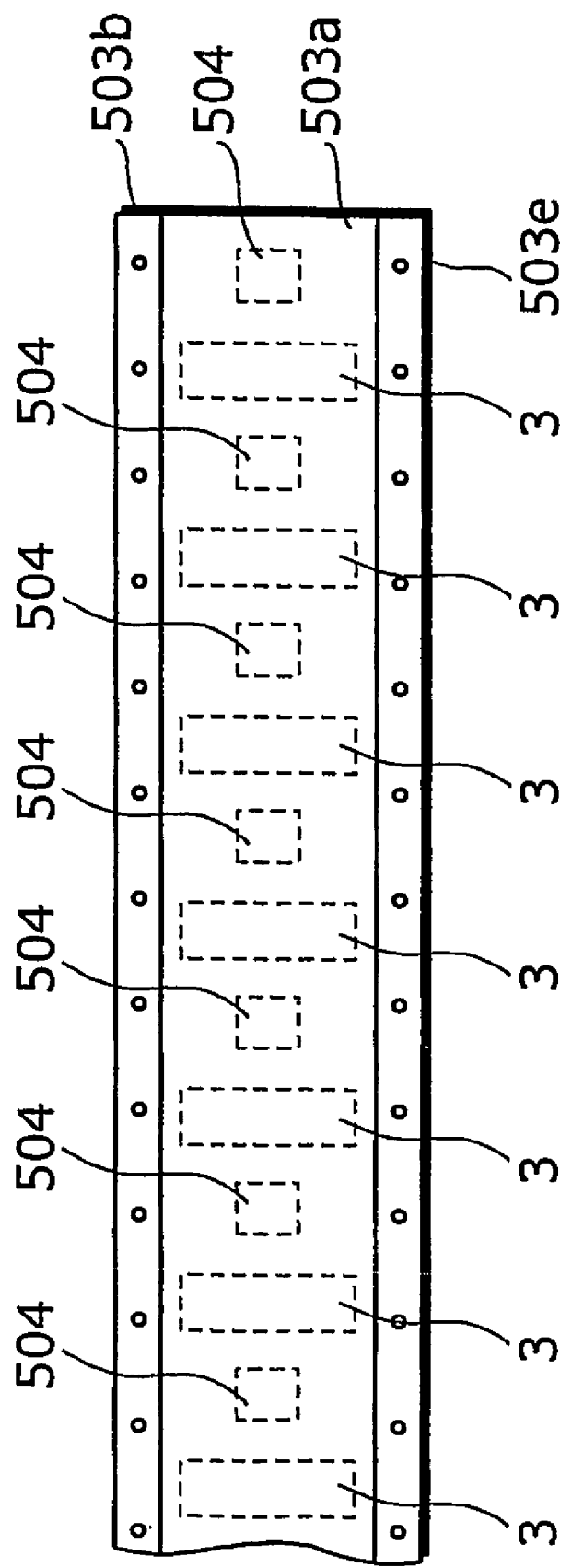
FIG. 34 is a front view of a component tape according to a variation of the third embodiment of the present invention.

FIG. 34 is a front view of a component tape according to the present variation.

A component tape 503*e* according to the present variation includes a plurality of tape IC tags 504.

More specifically, on the component tape 503*e*, a tape IC tag 504 is attached not only at the leading edge of a carrier tape 503*b*, but also at each position between electronic components 3 stored thereon.

The tape IC tag 504 attached at the leading edge stores component data of an electronic component 3 that is placed behind it (trailing edge direction), and the second tape IC tag 504 from the leading edge stores component data of an electronic component 3 that is placed behind it. In other words, each tape IC tag 504 stores component data of one electronic component 3 that is placed behind it.

As described above, even if the details of the respective electronic components 3 held by the component tape 503*e* such as component names and lot numbers, are different, it becomes possible to associate these details to corresponding electronic components 3 in a reliable manner, by attaching, to the component tape 503*e*, the number of tape IC tags 504 in conjunction with the number of the electronic components 3.

Furthermore, since a tape IC tag 504 of each electronic component 3 is attached forward of it (leading edge direction), it becomes possible to connect a middle part of a component tape 503*e* to the trailing edge of a component tape 503*e* being used. In other words, even in the case where a component tape 503*e* is required to be cut at such middle part, it becomes possible to connect another component tape 503*e* to a new leading edge that is created by such cut, by cutting the component tape 503*e* in a manner that any of the tape IC tags 504 is left to serve as a new leading edge.

(Variation 3)

Next, a description is given of a variation related to timing of updating the management data 507 according to the third embodiment.

In the third embodiment, the management data 507 is updated after all the electronic components 3 have been mounted onto a printed board 2 by each mounter, but in the present variation, mounted component information 507*b* included in the management data 507 is updated at timing at which the component data 505 is read from the tape IC tag 504 on a newly connected component tape 503 and stored into the data storing unit 515. Furthermore, the mounted component information 507*b* included in the management data 507 is updated, by use of the component data 505 that is already stored in the data storing unit 515, at timing at which a printed board 2 is inserted into a mounter and the management data 507 is read from the board IC tag 506 of such printed board 2 to be stored into the data storing unit 515.

In other words, when a printed board 2 is inserted, a mounter already recognizes the Z-axis position of a component tape 503 from which electronic components 3 should be taken as well as recognizing where on the printed board 2 to mount these electronic components. Therefore, at the point of time when the printed board 2 is inserted and its management data 507 is read, the mounter updates the mounted component information 507*b* by writing the details of the component data 505 that is stored in association with such Z-axis position, into each field of the mounted component information 507*b* included in such management data 507.

Here, sine the number of electronic components 3 is included in the component data 505, it is possible for the mounter to know the remaining number of the electronic components 3 by counting the number of electronic components 3 that have been taken out. As a result, when judging that the remaining number of the electronic components 3 is smaller than the number of electronic components that should be mounted onto one printed board 2, the mounter updates the contents of the mounted component information 507*b* so that it reflects information related to the remaining components. Then, at the timing at which the component data 505 is read from the tape IC tag 504 of a new component tape 503 and stored into the data storing unit 515, the mounter updates the mounted component information 507*b* included in the management data 507 related to the remaining electronic components 3 to be mounted, based on the contents of such read-out component data 505.

Note that in the case where an error of picking up/mounting an electronic component 3 occurs while a mounting operation is taking place, the mounter detects the occurrence of such error and modifies the current remaining number of electronic components since there is a possibility that the remaining number of electronic components 3 it knows and the actual remaining number may be different.

Furthermore, the mounted component information 507*b* included in the management data 507 may also be updated whenever necessary at timing at which each electronic component 3 is mounted onto a printed board 2.

For instance, when taking out an electronic component 3 from a component tape 503 located in a predetermined Z-axis position and mounting such electronic component 3 onto a printed board 2, each mounter updates the mounted component information 507b by writing the details of component data 505 that is stored in association with the above predetermined Z-axis position into each field of such mounted component information 507b included in the management data 507. When detecting the tape IC tag 504 of a newly replaced component tape 503, each mounter recognizes the Z-axis position of such component tape 503, deletes the component tape 505 that is already stored in association with such Z-axis position, and reads new component data 505 from the tape IC tag 504 of the replaced component tape 503 so as to store it in association with the above Z-axis position. Subsequently, the mounter updates the mounted component information 507b at the timing when mounting is performed, by writing the details of such new component data 505 to each field of such mounted component information 507b included in the management data 507.

Although only some exemplary embodiments and variations of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

For example, an IC tag is attached to a reel in the first and second embodiments and IC tag is attached to the leading edge of a component tape in the third embodiment and its variations, but an IC tag may be attached to other positions.

Figure 35:
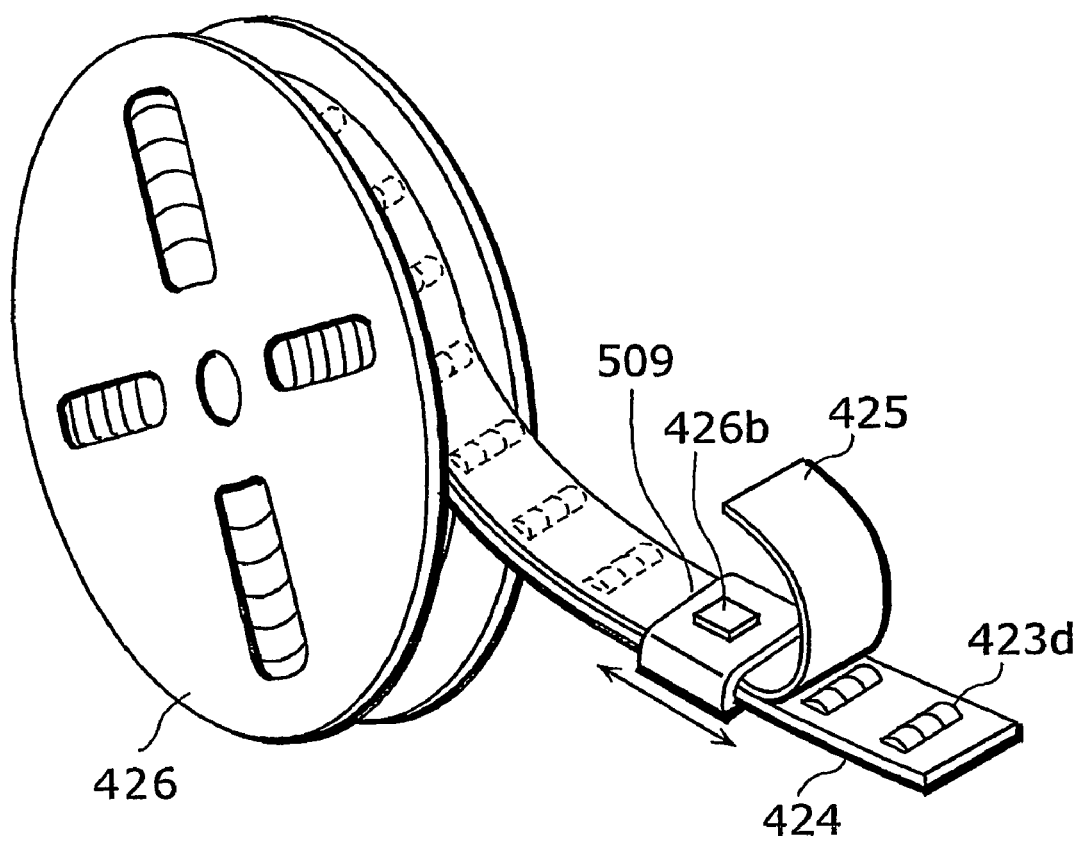
FIG. 35 is a diagram for illustrating another method for attaching an IC tag.

FIG. 35 is a diagram for illustrating another method for attaching an IC tag 426b.

In this attaching method, a slide material 509 is slidably attached to a component tape, and an IC tag 426b is attached to this slide material 509.

The IC tag 426b attached in the above manner is capable of remaining at a certain position on the mounter 100/200 even when the component tape is pulled out in a successive manner for component mounting. For example, by being locked at a predetermined position on the mounter 100/200, it becomes possible for the slide material 509 to remain on a certain position, sliding on a component tape being pulled out.

As a result, it becomes possible for the respective IC tag readers/writers 111 of the mounters 100 and 200 to read out component information from the IC tag 426b attached on such component tape even if it is in the middle of component mounting.

Moreover, it is also possible for the mounters 100 and 200 to store, in an IC tag 426b, the remaining number of electronic components 423d included in a component tape by use of the IC tag reader/writer 111. As a result, even if a component tape that is being used is removed from the mounter 100/200 together with the supply reel 426, a slide material 509 is attached to this component tape and the IC tag 426b attached to such slide material 509 stores the remaining number of electronic components. This enables a worker to manage the number of electronic components in a reliable manner without needing to count again the number of electronic components 3 included in the component tape that was removed in the middle of use.

Furthermore, an IC tag 426b is attached to a supply reel 426 in the first and second embodiments, but an IC tag 426b may be attached to tray, bulk, stick and the like as long as they are capable of holding a group of electronic components 423a to 423d.

Figure 36:
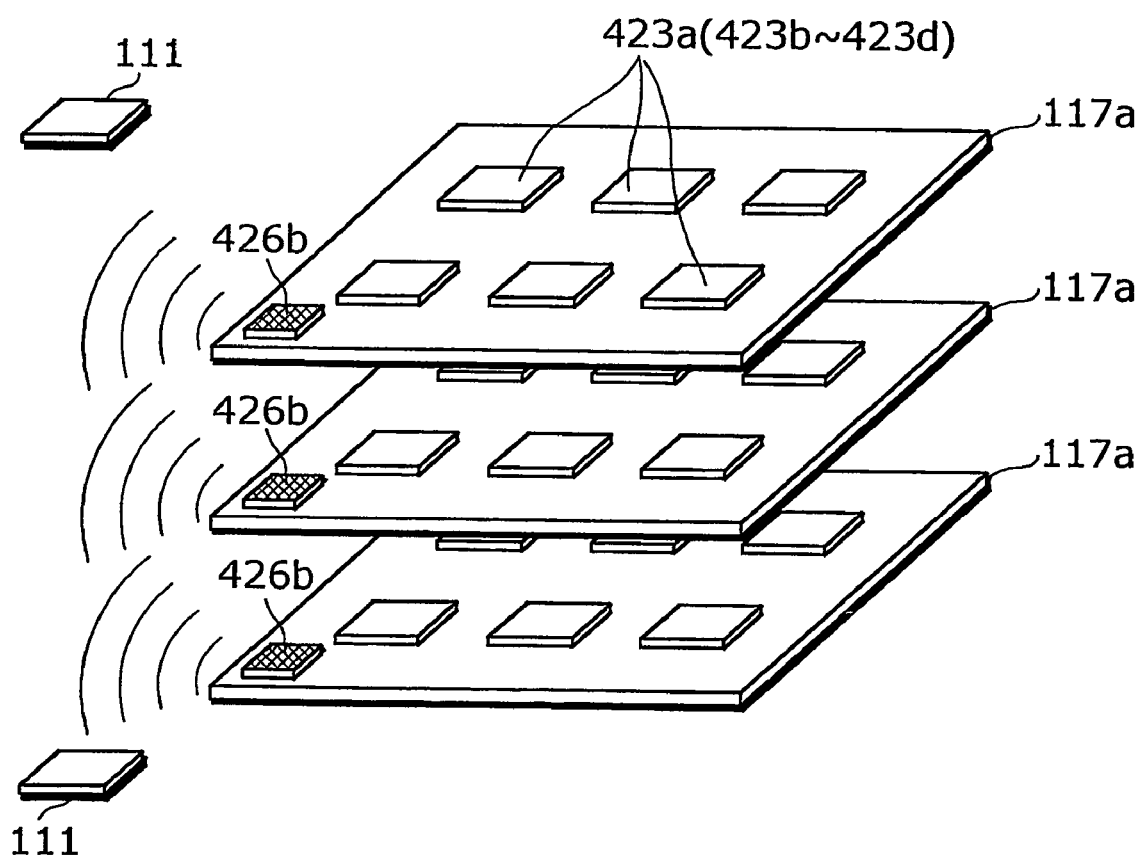
FIG. 36 is a diagram showing IC tags being attached to trays.

FIG. 36 is a diagram showing IC tags 426b being attached to trays.

Each tray 117a is intended for supporting a group of electronic components 423a to 423d so that they can be arranged on a plane. The tray supplying unit 117 contains a plurality of trays 117a that are laid one over another with a certain space between each tray 117a.

An IC tag 426b is attached to each of these trays 117a. The two IC tag readers/writers 11 specify the position of each IC tag 426b in a direction in which the trays 117a are laid, based on a result of receiving electric waves from the IC tag 426b attached to each of the trays 117a. Accordingly, the two IC tag readers/writers 111 can specify the position or number of each tray 117a as in the case of specifying Z numbers.

Figure 37:
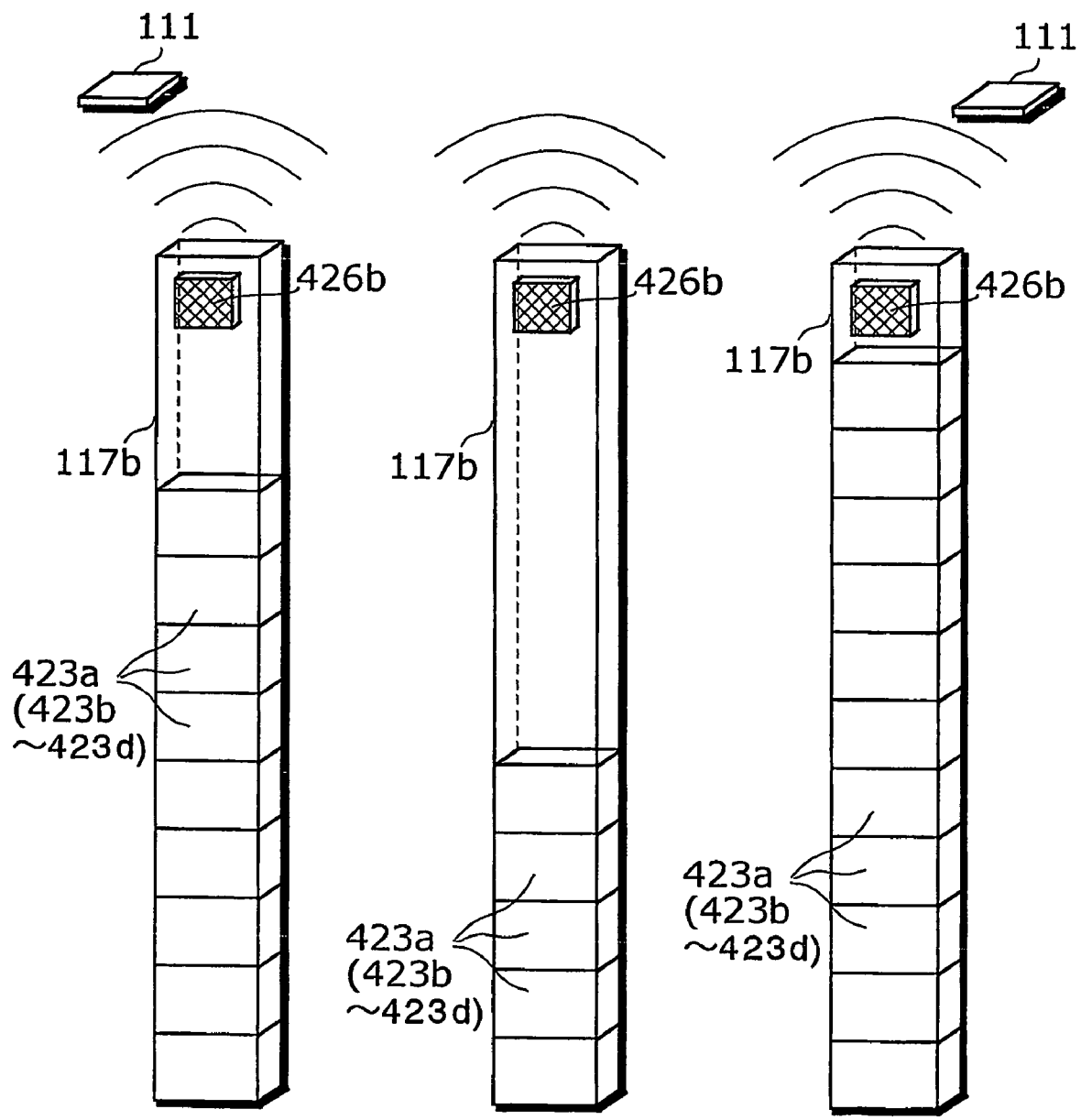
FIG. 37 is a diagram showing IC tags being attached to sticks.

FIG. 37 is a diagram showing IC tags 426b being attached to sticks.

Each stick 117b is a long narrow container being a resin molding, for example. A group of electronic components 423a to 423d are stored in each stick 117b so that they are laid over another with no space between each stick. A plurality of sticks 117b are attached inside each of the mounters 100 and 200 in a way that these sticks 117b are placed in a line with their longitudinal sides facing a vertical direction.

An IC tag 426b is attached to each of these sticks 117b. The two IC tag readers/writers 111 specify the position of each IC tag 426b in a direction in which the sticks 117b are laid, based on a result of receiving electric waves from the IC tag 426b attached to each of the sticks 117b. Accordingly, the two IC tag readers/writers 111 can specify the position or number of each stick 117b as in the case of specifying Z numbers.

Furthermore, an IC tag 426b may be attached not only to a stick, a bulk (bulk cassette), a tray, a component tape, and a reel, but also to any component holders that is capable of holding a group of electronic components, such as a component cassette (feeder) 114.

Note that in the first and second embodiments, the mounter 100 that uses component cassettes 114 has been explained, but there also exists a mounter in which a component tape is not contained in a component cassette 114. Such mounter is equipped with a mechanism for transporting tapes to a component supplying unit. In such case, by setting a component tape in this tape transport mechanism, it becomes possible to transport component tapes intermittently and thus to supply components.

Note that in the first and second embodiments, the component verification apparatus 300 performs component verification, but it is also possible that the mounters 100 and 200 are each equipped with the functionality of the component verification apparatus 300. In this case, the mounter 100/200 verifies the component information read from an IC tag 426b and the Z number of the component tape against the component arrangement data, and when they agree with each other, the mounter 100/200 takes out the components from the component tape and mounts them onto a board.

Furthermore, in the third embodiment and its variations, component data 505 is written to a tape IC tag 504 that is attached to a carrier tape 503b in advance, but it is also possible to write component data 505 to a tape IC tag 504 first and then attach the tape IC tag 504, to which the component data 505 has been written, to a component tape 503. In this case, it is easy to connect an arbitrary part (middle part) of a new component tape 503 to the component tape 503 currently in use. In other words, when a middle part of a new component tape 503 is required to be attached to the trailing edge of the component tape 503 in use, such new component tape 503 is cut in said middle part, and the tape IC tag 504 to which the component data 505 has been written is attached to a new leading edge created by cutting such new component tape 503.

Moreover, a tape IC tag 504 is attached to a component tape 503 in the third embodiment and its variations, but it is also possible to attach a 2D barcode, for example.

Furthermore, in the third embodiment and its variations, component name and lot number are stored as items of mounted component information 507b included in management data 507, but it is also possible to further include items included in component data 505 such as vendor code, component shape, manufacturing date, and opened date. By storing such items, it becomes possible to manage electronic components 3 mounted on a printed board 2 according to their vendor code and opened date, and the like.

Moreover, a plurality of tape IC tags 504 are attached to a component tape 503e in the third embodiment and its variation 2, but it is also possible to replace these tape IC tags 504 by barcodes, for example, except for the tape IC tag 504 placed at the front edge. In this case, the top tape IC tag 504 stores, as component data 505, the details related only to an electronic component 3 that is stored at the front edge of the component tape 503e and the barcodes that contain the details related to the other electronic components 3 represent the details other than such component data 505 stored by the top tape IC tag 504. In general, the amount of information that can be contained in a barcode is smaller than that of an IC tag, but there is an advantage that the production cost of component tapes 503e can be reduced by using barcodes to represent only differences from the top tape IC tag 504.

INDUSTRIAL APPLICABILITY

The present invention is capable of being employed for a component mounting system and the like in which components of various types can be mounted at a time.

The invention claimed is:

1. A component verification method for verifying, by use of a computer, whether a component holder holding a plurality of components is correctly placed in a component supplying unit which supplies the components to a mounter, and
    wherein the component holder is placed in the component supply unit with an integrated circuit (IC) tag being attached to the component holder, the IC tag storing identification information for identifying the components held by the component holder,
    the component verification method comprising:
    a position specification step of specifying a placement position in the component supplying unit where the component holder is placed, based on a difference in position coordinates of each of a plurality of IC tags including the IC tag, the position coordinates being obtained based on a state of a signal received from each of the plurality of IC tags, wherein each of the plurality of IC tags is attached to a corresponding one of a plurality of component holders including the component holder;
    a read step of reading the identification information from the IC tag attached to the component holder, the IC tag having position coordinates corresponding to the placement position of the component holder specified in the position specification step; and
    a verification step of verifying (i) the identification information read out in the read step against prescribed component information for identifying a component that should be mounted onto the board, and (ii) the placement position specified in the position specification step against prescribed position information indicating a position where the component holder should be placed.

2. The component verification method according to claim 1,
    wherein in the position specification step, the position coordinates of the IC tag are obtained by judging a reception direction of the signal from the IC tag according to a ratio of strength of the signal received from the IC tag by two IC tag readers.

3. The component verification method according to claim 1,
    wherein the component holder is a component tape, and
    the component verification method further comprises:
    a detection step of detecting a seam where a terminating end of the component tape and a new component tape are connected,
    wherein in the position specification step, when the seam is detected in the detection step, a placement position of the new component tape is further obtained,
    in the read step, identification information is further read from an IC tag having position coordinates corresponding to the specified placement position of the new component tape, and
    in the verification step, the identification information corresponding to the new component tapes read out in the read step, is further verified against the prescribed component information.

4. The component verification method according to claim 1, wherein:
    the IC tag further stores alternative component information for identifying an alternative component that can serve as an alternative to each of the components held by the component holder;
    in the read step, the alternative component information is further read from the IC tag attached to the component holder; and
    in the verification step, the identification information and the alternative component information read out in the read step are verified against the prescribed component information.

5. The component verification method according to claim 4,
    wherein, in the verification step, when the alternative component information is verified against the prescribed component information, at least one of the following items that are related to the alternative component indicated in the alternative component information is verified against a corresponding item indicated in the prescribed component information: a name; a shape; and a characteristic value.

6. The component verification method according to claim 1, further comprising:
    a warning step of warning that a wrong component holder is placed in the component supplying unit in the case where the identification information disagrees with the prescribed component information as a result of the verification performed in the verification step.

7. The component verification method according to claim 1, wherein:
    a plurality of sensors are attached in a plurality of positions on the component supplying unit where the component holder can be placed, said sensors being capable of detecting that the component holder has been placed,
    in the position specification step, the placement position of the component holder is specified based on a result of the detection of each of the sensors, and in the read step, the identification information is read from the IC tag having the position coordinates corresponding to the specified placement position of the component holder.

8. A component number examination method for examining, by use of a computer, a number of components held by a component holder that holds a plurality of components, said number of components being subject to change when a component is taken out from said component holder by a mounter,
wherein the component holder is placed in a component supplying unit which supplies the components to the mounter, with an integrated circuit (IC) tag being attached to said component holder, the IC tag storing the number of components and identification information for identifying the components held by the component holder, and
the component number examination method comprises the following steps in addition to the steps included in the component verification method according to claim 1:
a component number read step of reading the number of components from the IC tag attached to the component holder;
a decrement step of decrementing the number of components read out in the component number read step by one, every time the mounter takes out a component from the component holder for mounting the component onto a board; and
a warning step of issuing a warning when the number of components after the decrement in the decrement step becomes less than a predetermined value.

9. The component number examination method according to claim 8, further comprising:
a termination step of terminating the mounting of the components onto the board by prohibiting the mounter from taking out any components from the component holder, when the number of components after the decrement in the decrement step becomes zero.

10. A component verification apparatus that verifies, by use of a computer, whether a component holder holding a plurality of components is correctly placed in a component supplying unit which supplies the components to a mounter,
wherein the component holder is placed in the component supplying unit with an integrated circuit (IC) tag being attached to the component holder, the IC tag storing identification information for identifying the components held by the component holder,
the component verification apparatus comprising:
a position specification unit operable to specify a placement position in the component supplying unit where the component holder is placed, based on a difference in position coordinates of each of a plurality of IC tags including the IC tag, the position coordinates being obtained based on a state of a signal received from each of the plurality of IC tags, wherein each of the plurality of IC tags is attached to a corresponding one of a plurality of component holders including the component holder;
a read unit operable to read the identification information from the IC tag attached to the component holder, the IC tag having position coordinates corresponding to the placement position of the component holder specified by the position specification unit; and
a verification unit operable to verify (i) the identification information read out by the read unit against prescribed component information for identifying a component that should be mounted onto the board, and (ii) the placement position specified by the position specification unit against prescribed position information indicating a position where the component holder should be placed.

11. A component number examination apparatus that examines, by use of a computer, a number of components held by a component holder holding a plurality of components, the number of components being subject to change when a component is taken out from the component holder by a mounter,
wherein the component holder is placed a component supplying unit which supplies the components to the mounter, with an integrated circuit (IC) tag being attached to said component holder, said IC tag storing the number of components and identification information for identifying the components held by the component holder, and
the component number examination apparatus comprises the following units in addition to the component verification apparatus according to claim 10:
a component number read unit operable to read the number of components from the IC tag attached to the component holder;
a decrement unit operable to decrement, by one, the number of components read out by the component number read unit, every time the mounter takes out a component from the component holder for mounting the component onto a board; and
a warning unit operable to issue a warning when the number of components after the decrement by the decrement unit becomes less than a predetermined value.

\* \* \* \* \*